United States Patent [19]
Rodgers et al.

[11] Patent Number: 5,977,638
[45] Date of Patent: Nov. 2, 1999

[54] EDGE METAL FOR INTERCONNECT LAYERS

[75] Inventors: T. J. Rodgers, Woodside; Sam Geha, Sunnyvale; Chris Petti, Mountian View; Ting-Pwu Yen, Fremont, all of Calif.

[73] Assignee: Cypress Semiconductor Corp., San Jose, Calif.

[21] Appl. No.: 08/754,521

[22] Filed: Nov. 21, 1996

[51] Int. Cl.$^6$ .............................. H01L 23/48; H01L 21/44
[52] U.S. Cl. ......................... 257/773; 257/775; 438/639; 438/669
[58] Field of Search ................................ 438/639, 669, 438/637; 257/776, 758, 773, 775

[56] References Cited

U.S. PATENT DOCUMENTS

| | | | |
|---|---|---|---|
| 4,566,175 | 1/1986 | Smayling et al. | 29/576 |
| 4,656,732 | 4/1987 | Teng et al. | 29/591 |
| 4,666,737 | 5/1987 | Gimpelson et al. . | |
| 4,789,648 | 12/1988 | Chow et al. | 437/225 |
| 4,868,100 | 9/1989 | McDavid | 357/23.3 |
| 4,868,136 | 9/1989 | Ravaglia | 437/38 |
| 4,902,377 | 2/1990 | Berglund et al. | 156/643 |
| 4,933,743 | 6/1990 | Thomas et al. | 357/71 |
| 4,962,060 | 10/1990 | Sliwa et al. | 437/192 |
| 5,093,279 | 3/1992 | Andreshak et al. | 437/173 |
| 5,110,760 | 5/1992 | Hsu . | |
| 5,202,279 | 4/1993 | Chung et al. | 437/47 |
| 5,204,276 | 4/1993 | Nakajima et al. | 437/31 |
| 5,271,798 | 12/1993 | Sandhu et al. | 156/638 |
| 5,286,674 | 2/1994 | Roth et al. | 437/190 |
| 5,302,266 | 4/1994 | Grabarz et al. | 204/192.12 |
| 5,312,777 | 5/1994 | Cronin et al. | 437/195 |
| 5,331,116 | 7/1994 | Haslam et al. | 174/250 |
| 5,371,047 | 12/1994 | Greco et al. | 437/238 |
| 5,429,970 | 7/1995 | Hong | 437/43 |
| 5,496,771 | 3/1996 | Cronin et al. | 437/187 |
| 5,497,017 | 3/1996 | Gonzales | 257/306 |
| 5,521,118 | 5/1996 | Lam et al. . | |
| 5,539,255 | 7/1996 | Cronin | 257/750 |
| 5,545,590 | 8/1996 | Licata . | |
| 5,571,751 | 11/1996 | Chung . | |
| 5,578,523 | 11/1996 | Fiordalice et al. | 437/190 |
| 5,595,937 | 1/1997 | Mikagi | 437/192 |
| 5,618,742 | 4/1997 | Shone et al. | 438/263 |
| 5,663,101 | 9/1997 | Cronin . | |
| 5,686,357 | 11/1997 | Howard . | |

OTHER PUBLICATIONS

"A Novel Local Interconnect Technology (MSD) For High–Performance Logic LSIs With Embedded SRAM"; by T. Uehara, et al.; IEEE 1996 Symposium on VLSI Technology Digest of Technical Papers; pp. 142–143.

*Primary Examiner*—Caridad Everhart
*Attorney, Agent, or Firm*—Blakely, Sokoloff, Taylor & Zafman LLP

[57] ABSTRACT

A method of forming edge metal lines to interconnect features in a semiconductor device. One embodiment comprises the steps of: patterning a first insulating layer to form a first feature having a first sidewall; depositing a metal layer over the first feature; and etching the metal layer so that a first edge metal line is formed adjacent to the first sidewall. The edge metal line may be substantially anisotropically etched to form the edge metal line. The edge metal line may comprise a plurality of metal layers. The edge metal line may also interconnect features in a semiconductor device (e.g., contacts). The method may further comprise the step of forming a protective coating over a portion of the metal layer such that the etching step may form a metal interconnect line and the edge metal line from the same metal layer. The metal interconnect line may comprise a bus that may have more current carrying capacity than the edge metal line.

44 Claims, 28 Drawing Sheets

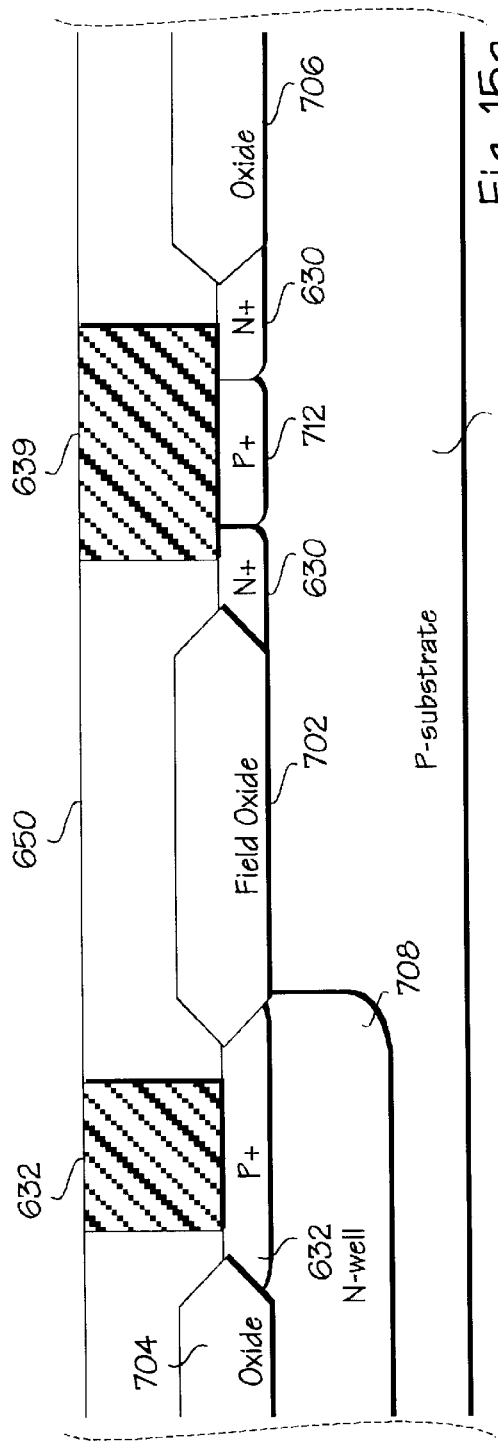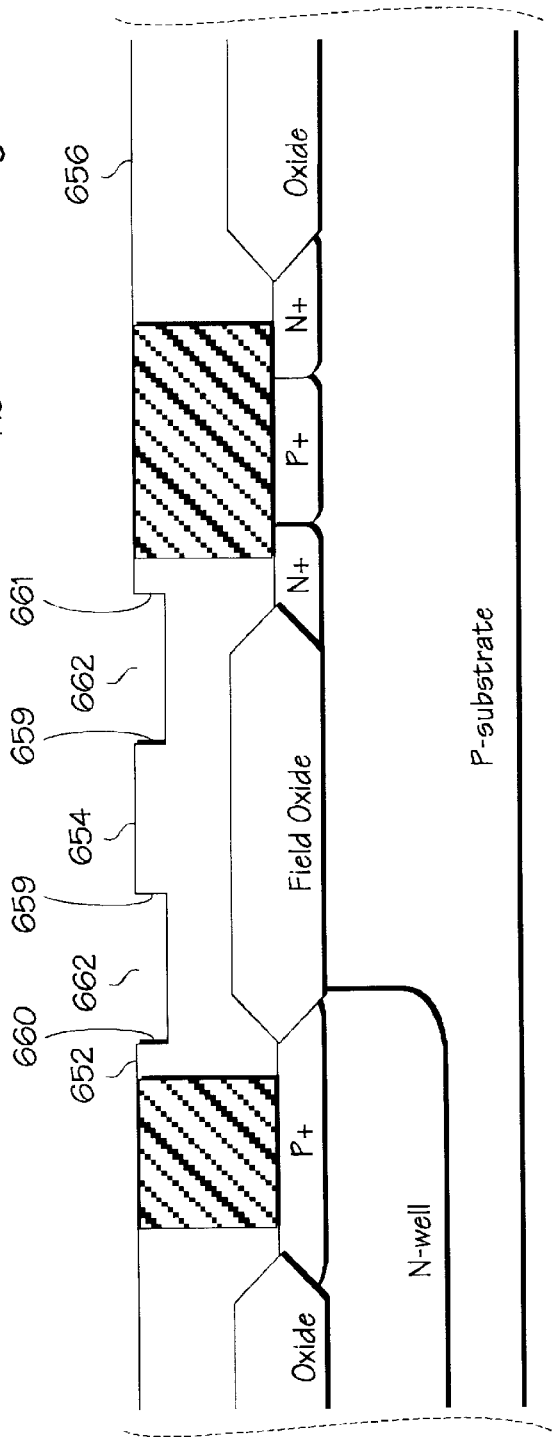
Fig. 15a
Fig. 15b

EDGE METAL FOR INTERCONNECT LAYERS

BACKGROUND OF THE INVENTION

1. Field of the Invention

The present invention generally relates to the field of semiconductor fabrication. More particularly, the present invention relates to a method and apparatus for forming edge metal to interconnect features in a semiconductor device.

2. Art Background

Lithography processes are typically used for semiconductor fabrication. A typical lithography process for forming two metal lines is illustrated in FIGS. 1a–1d. FIG. 1a shows a metal layer 12 deposited over a substrate 10. As illustrated in FIG. 1b, a positive photoresist 14 is then deposited over metal layer 12 and is exposed to radiation 18 through mask 16. Mask 16 has opaque features 22 and clear features 20.

Radiation 18 serves to render soluble in a suitable developer that portion of photoresist 14 exposed to radiation 18 through clear features 20. That portion of photoresist 14 that has not been exposed to radiation remains relatively insoluble in the developer. Photoresist layer 14 may then be developed in a suitable developer to form features 24 as illustrated in FIG. 1c. Metal layer 12 may then be subjected to a suitable metal etch that removes portions of metal layer 12 not covered by features 24. Features 24 may then be suitably removed leaving metal lines 26 and 28 as illustrated in FIG. 1d.

FIG. 2 shows a top view of metal lines 26 and 28. As illustrated in FIG. 2, metal line 26 interconnects two contacts 30 and 31 that may be formed in substrate 10 of FIG. 1a. Contacts 30 and 31 may also be referred to as "nails" or "plugs." Similarly, metal line 28 interconnects two contacts 32 and 33 that may be formed in substrate 10 of FIG. 1a.

The typical lithography process illustrated in FIGS. 1a–1d limits the size and density with which semiconductor devices may be fabricated. For example, the minimum resolution capability of the lithography process determines the minimum pitch 27 for metal lines 26 and 28. The pitch may be twice the width of one of the metal lines. For example, if a metal line is 0.5 μm wide, then the pitch is 1.0 μm. As illustrated in FIG. 2, the spacing between contacts 30 and 32, and between contacts 31 and 33, is also limited by the pitch of metal lines 26 and 28.

The pitch may depend on the lens used in exposing the photoresist to radiation through mask 16. The pitch may also depend on the equipment used to form metal lines 26 and 28. Typically, a machine (e.g., a stepper) that is capable of producing a pitch 27 for metal lines 26 and 28 of approximately 1.1 μm (micrometers or microns), costs approximately three times as much as a machine capable of producing a pitch of approximately 1.8 μm, and approximately 30 times as much as a machine capable of producing a pitch of approximately 2.2 μm. Therefore, the cost of purchasing equipment to manufacture metal lines having a small pitch can be extremely expensive. Therefore, what is needed is a method of forming metal lines having a reduced pitch using existing or older machines without the need to purchase more expensive newer equipment. Also what is needed is the ability to form smaller pitches than what is possible using existing fabrication equipment and the conventional lithography process illustrated in FIGS. 1a–1d. Additionally, what is needed is the ability to form smaller metal lines having smaller pitches to that the density of metal lines formed on a semiconductor substrate is increased relative to conventional lithography processes.

Given that fabrication densities are limited by the pitch of metal lines, semiconductor device manufacturers have increasingly gravitated to forming multiple layers of metal lines or interconnect to reduce the area of the silicon substrate used to build a device. Each layer of interconnect is still limited by the pitch between metal lines, but more features can be stacked onto a piece of silicon by using multiple layers of interconnect than is possible if only a single layer of metal or interconnect was employed to interconnect features of a device. Typical memory cells (e.g., SRAM cells) may use one layer of local interconnect formed from titanium (Ti), a mixture of Ti and tungsten, or other conductive material, and multiple layers of metal lines formed from aluminum (Al), copper (Cu), or other metal.

A typical process for cross-coupling pairs of contacts using multiple layers of interconnect is illustrated in FIGS. 3a–3d. FIG. 3a shows four contacts 40–43 which may be formed in an oxide layer (not shown). A first layer of metal or a local interconnect layer is deposited over contacts 40–43, exposed to a metal mask and etched to form metal line 46 interconnecting contacts 41 and 43 as illustrated in FIG. 3b. An interlayer dielectric 48 (e.g., $SiO_2$) is formed over contacts 40–43 and metal line 46 as illustrated in FIG. 3c. Interlayer dielectric 48 may then be planarized as known in the art. Openings 50 and 52 may then be formed in interlayer dielectric 48 using a contact mask and etch. As illustrated in FIG. 3c, openings 50 and 52 provide a via to contacts 40 and 42. A second layer of metal may then be deposited over contacts 40–43, inter-layer dielectric 48 and openings 50 and 52. The second layer of metal may then be exposed to another metal mask and etched to form metal line 54 interconnecting contacts 40 and 42 as illustrated in FIG. 3d. Another inter-layer dielectric (not shown) would then be formed over contacts 40–43 and metal lines 46 and 54, and planarized. To further interconnect contacts 40–43 to other contacts or features elsewhere in the semiconductor device, another contact mask and etch would be required to form an opening to the appropriate contact(s), and another layer of metal would then be deposited, exposed to a third metal mask, and etched to form the interconnection.

As illustrated in FIGS. 3a–3d, forming a semiconductor device using multiple layers greatly increases the amount of time required to manufacture a device, the probability of quality and reliability problems, the cost of materials to form the device since more materials are used, and the cost of manufacturing the device. Therefore, what is needed is a method to reduce the number of process steps, the number of layers of interconnect and/or metal lines required in a semiconductor device, the cost and time of manufacturing a semiconductor device, and the quality and reliability problems associated with constructing a device from multiple layers of interconnect. Furthermore, what is needed is a method of fabricating a semiconductor device using a reduced number of interconnect layers without substantially increasing the size of the device.

Previous metal lines that have been formed along an edge or sidewall of a feature have been considered to be defects or undesirable features. For example, an MSD process for achieving low sheet resistance of a source/drain local interconnect is described by Uehara et al. in A NOVEL LOCAL INTERCONNECT TECHNOLOGY (MSD) FOR HIGH-PERFORMANCE LOGIC LSIS WITH EMBEDDED SRAM (1996 Symposium on VLSI Technology, pp 142–143, published by IEEE, Piscataway, N.J. (1996)). FIG. 3(b) of Uehara et al. discloses that MSD without a mask may form separate source/drain local interconnect next to sidewall spacers when the gate electrode distance is greater than approximately 0.8 μm. However, Uehara et al. did not test an MSD structure where the gate electrode distance was greater than 0.6 μm apparently due to concerns about forming a source/drain local interconnect having an extremely high sheet resistance (e.g., an open circuit).

In conventional etching technology, undesirable metal "stringers" may be formed between metal lines as a result of incomplete etching. For example, FIG. 20a shows a cross-sectional view of a metal layer 2004 disposed over substrate 2000 and feature 2002 having sidewall 2003. Metal layer 2004 may be patterned (e.g., metal mask plus isotropic etch) to form metal lines 2006 and 2008 as shown in FIG. 20b. If the patterning does not completely remove the metal layer next to sidewall 2003, then a metal stringer 2008 may remain next to sidewall 2003. The metal stringer is an undesirable structure that may short metal lines 2006 and 2008. Processes are generally designed so that the metal etch sufficiently eliminates metal stringers.

SUMMARY OF THE INVENTION

The present invention concerns a method of forming edge metal lines to interconnect features in a semiconductor device. One embodiment comprises the steps of: patterning a first insulating layer to form a first feature having a first sidewall; depositing a metal layer over the first feature; and etching the metal layer so that a first edge metal line is formed adjacent to the first sidewall. The edge metal line may be substantially anisotropically etched to form the edge metal line. The edge metal line may comprise a plurality of metal layers. The edge meal line may also interconnect features in a semiconductor device (e.g., contacts). The method may further comprise the step of forming a protective coating over a portion of the metal layer such that the etching step may form a metal interconnect line and the edge metal line from the same metal layer. The metal interconnect line may comprise a bus that may have more current carrying capacity than the edge metal line.

The present invention also concerns a method of forming an edge metal line and a contact from the same metal layer. The method comprises the steps of: forming a first trench having a sidewall in an insulating layer; forming a second trench in a portion of the first trench; depositing a conductive layer over the first and second trench; and etching the conductive layer to form an edge metal line adjacent to the sidewall and a contact in the second trench.

The present invention also concerns a method of forming a "pseudo-damascene" metal line. The pseudo-damascene metal line, an edge metal line, a standard metal line, and/or a contact may be formed from the same conductive layer.

The present invention may enable more interconnect and/or metal lines to be formed in a given area as compared with conventional lithography methods of forming metal lines. For one embodiment, the use of edge metal lines may enable the doubling of metal line density in a given area of silicon compared with conventional lithography processes of generating metal lines.

The present invention may also reduce the number of layers of interconnect and/or metal lines required to interconnect features of a semiconductor device. For example, the present invention may be used to interconnect transistors used in a static random access memory (SRAM) cell using only one layer of edge metal in approximately the same area previously requiring up to one layer of local interconnect and two layers of metal lines.

Other features and advantages of the present invention will be apparent from the accompanying drawings and from the detailed description that follows.

BRIEF DESCRIPTION OF THE DRAWINGS

The features and advantages of the present invention are illustrated by way of example and are by no means intended to limit the scope of the present invention to the particular embodiments shown, in which:

FIG. 10b is a top view of FIG. 10a;

FIGS. 15a–15c are a cross sectional views of forming the SRAM device along line X—X of FIGS. 14a–14c;

DETAILED DESCRIPTION

A method and apparatus for forming edge metal for use as a layer of interconnect is disclosed. In the following description, for purposes of explanation, specific details are set forth such as specific materials, thicknesses, parameters, etc., in order to provide a thorough understanding of the present invention. However, it will be apparent to one skilled in the art that these specific details may not be required to practice the present invention. In other instances, well-known process steps, equipment, etc., have not been described in particular detail so as not to obscure the present invention.

The present invention uses sidewall spacer technology to produce metal lines or interconnect that are significantly smaller than conventional metal lines formed through conventional lithography processes. Sidewall spacer technology conventionally forms silicon oxide or silicon nitride spacers next to the sidewall of a gate electrode of a MOSFET transistor, and has generally been used to create graded junctions between heavily doped source-drain regions and a channel region of a MOSFET transistor. For example, U.S. Pat. No. 4,566,175 discloses forming spacers on the sidewalls of a polysilicon gate to create a space or gap between heavily-doped source/drain N+ regions and the gate so that a transistor can have shallow, lightly-doped source and drain regions adjacent to the channel. U.S. Pat. No. 5,204,276 also discloses that sidewall spacer technology has been used to reduce the width of an emitter region of a bipolar transistor prior to diffusion of the emitter region. Sidewall spacer technology has not been used to create relatively small metal lines (e.g., in comparison to existing metal interconnect technology) that may be used to interconnect contacts or other features in a semiconductor device.

The metal lines produced by the embodiments described herein may be referred to as "edge metal" lines or "sidewall interconnect." The edge metal lines may be formed adjacent to an edge or sidewall of a feature. The edge metal lines may be formed from any type of metal, any type of conductive material, or may comprise multiple conductive layers of material.

Figure 4A:
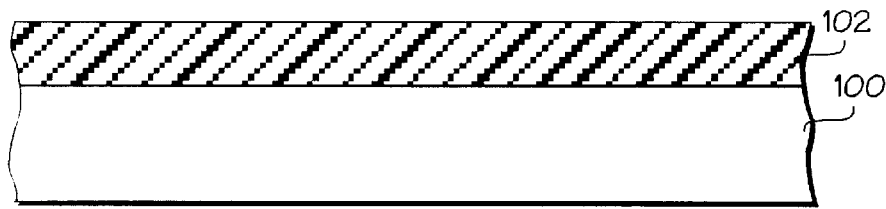
FIGS. 4a–4d are cross sectional views of one embodiment of a process of forming edge metal lines.

In contrast to conventional processes, the present invention may advantageously form edge metal lines adjacent to the edge or sidewall of a feature. FIGS. 4a–4d illustrate one embodiment of forming edge metal lines. In FIG. 4a, a semiconductor substrate 100 is provided. Substrate 100 may comprise any layer upon which edge metal lines may be formed. For example, substrate 100 may be silicon or a dielectric layer such as $SiO_2$.

As illustrated in FIG. 4a, an insulating layer 102 may be formed over substrate 100. Insulating layer 102 may include any suitable material formed to any suitable thickness using any suitable technique for forming insulating layer 102. For example, insulating layer 102 may comprise a dielectric layer including $SiO_2$. For another example, insulating layer 102 may comprise an imaging layer including a suitable positive photoresist, a suitable negative photoresist, a suitable radiation-sensitive polyimide, or other suitable radiation sensitive materials.

Figure 4B:
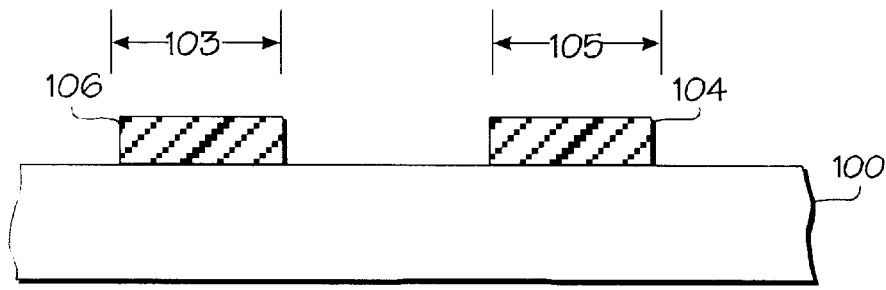

As illustrated in FIG. 4b, insulating layer 102 is patterned to form features 104 and 106. Patterning may include the lithography process of depositing a suitable imaging layer over insulating layer 102, exposing the insulating layer to suitable radiation through a mask, developing the imaging layer if required, etching the insulating layer, and removing the imaging layer.

Insulating layer 102 may be etched for a duration of time so that features 104 and 106 are no longer connected by insulating layer 102 as illustrated in FIG. 4b. Alternatively, insulating layer 102 may be etched for a suitable amount of time so that a trench is formed in insulating layer 102 between features 104 and 106.

Features 104 and 106 may have widths 103 and 105, respectively, that may be any suitable size. Width 103 or width 105 may be a minimum width for the type of fabrication equipment and mask sets used to form feature 104 and 106. For example, the minimum width may be from approximately 0.1 $\mu$m to about 2.0 $\mu$m, preferably from approximately 0.2 $\mu$m to about 1.0 $\mu$m, and more preferably from approximately 0.25 $\mu$m to 0.7 $\mu$m. In a more specific example, the minimum line width may be 0.25 $\mu$m using lithographic techniques and equipment having 0.5 $\mu$m resolution. Features 104 and 106 may each have any suitable thickness 107. For example, thickness 107 may be from approximately 1000 Angstroms to approximately 10,000 Angstroms. For one embodiment, thickness 107 may be approximately 4000 Angstroms.

Figure 4C:
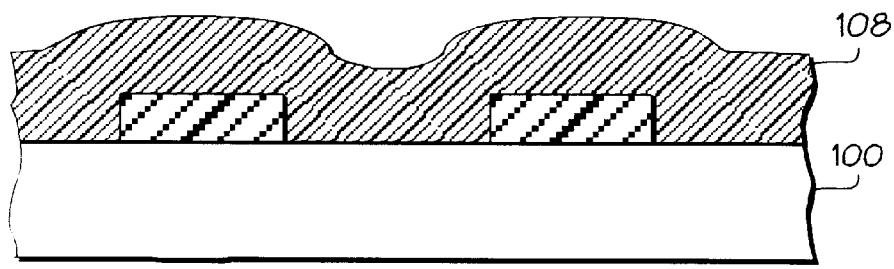
Figure 18:
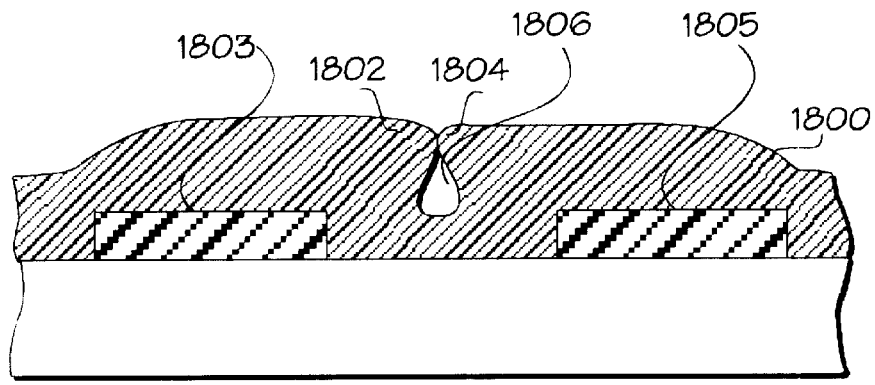
FIG. 18 is a cross sectional view of a conductive layer experiencing the breadloafing effect.

As illustrated in FIG. 4c, a conductive layer 108 may be formed over substrate 100, and features 104 and 106. Conductive layer 108 may include any suitable conductive material formed to any suitable thickness using any suitable technique. For example, conductive layer may be a metal layer (e.g., aluminum, Al), a local interconnect layer (e.g., titanium-tungsten, TiW), or a plurality of conductive layers (e.g., a first layer of TiW and a subsequent layer of Al), or any combination thereof. For one embodiment, conductive layer 108 may comprise a TiW underlayer and a layer of Al deposited at a temperature greater than or equal to 350° C. Depositing Al at a temperature greater than or equal to 350° C. may substantially eliminate any "breadloafing effect". A typical breadloafing effect is illustrated in FIG. 18. When conductive layer 1800 is formed over features 1803 and 1805, regions 1802 and 1804 may form a void 1806 which may cause problems later in the fabrication process as generally known in the art.

Figure 4D:
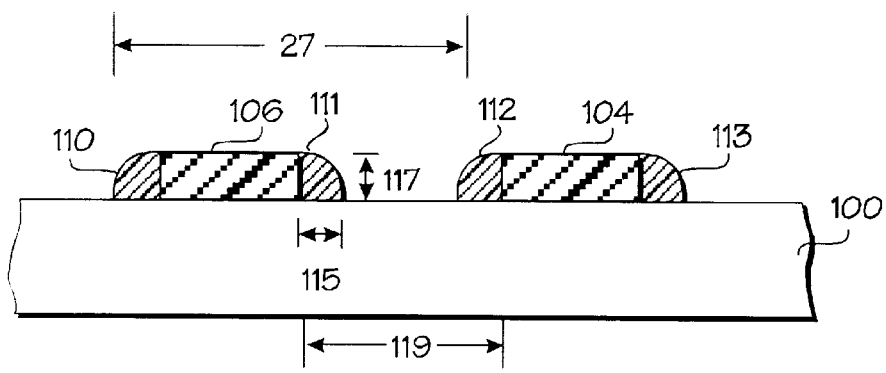

As illustrated in FIG. 4d, conductive layer 108 may be subjected to a directional or anisotropic etch using, for example, reactive ion etching or a plasma etch to remove all of conductive layer 108 on the horizontal surfaces of features 104 and 106. As generally known in the art, the directional etch may be substantially anisotropic or have a substantially anisotropic effect. The anisotropic etch of a conductive layer illustrated in each embodiment disclosed in this application may be considered to be substantially or wholly anisotropic, and achieve a substantially anisotropic effect.

As generally known in the art, a photoresist mask may be used prior to etching conductive layer 108. For example chlorine is often used to etch Al; however, chlorine generally isotropically etches Al. A resist mask may be used to minimize the isotropic effect and result in conductive layer 108 being substantially etched anisotropically (e.g., with a substantial anisotropic effect). For example, a photoresist layer may be deposited over conductive layer 108 comprising Al. The photoresist layer may then be patterned to form openings over areas of the Al to be etched. The carbon from the photoresist may react with or otherwise passivate the exposed vertical sidewalls of the metal being etched, and thus retard metal etching along the vertical sidewall of the metal layer. For another example, nitrogen may be added to the etch chemistry to cause a similar effect. These etching techniques may be used for all embodiments described in this application.

Anisotropically etching layer 108 leaves edge metal lines 110 and 111 formed adjacent to the sidewalls of feature 106, and edge metal lines 112 and 113 adjacent to feature 104. Edge metal lines 110–113 may also be referred to as "sidewall interconnect" or "sidewall interconnect lines" throughout this application.

Edge metal lines 110–113 may be of any suitable thickness, 117, and any suitable width, 115. For one embodiment, thickness 117 of edge metal lines 110–113 may be from approximately 1000 Angstroms to approximately 20,000 Angstroms. For example, the thickness of each of edge metal line 110–113 may be approximately 4000 Angstroms. For one embodiment, edge metal lines 110–113 may be approximately the same thickness as features 104 and 106. For another embodiment, edge metal lines 110–113 may have a thickness less than the thickness of features 104 and 106. Width 115 of edge metal lines 110–113 may be any suitable width to provide the current carrying capacity required by the circuit using at least one of the edge metal lines 110–113 as an interconnect line. For example, width 115 of edge metal lines 110–113 may be from approximately 100 Angstroms to approximately 10,000 Angstroms, preferably from approximately 250 Angstroms to approximately 5000 Angstroms, and more preferably from approximately 400 Angstroms to approximately 2000 Angstroms. For one embodiment, width 115 of the edge metal lines may be approximately 1460 Angstroms, and in another embodiment about 750 Angstroms.

As illustrated in FIG. 4d, a trench may be formed between features 104 and 106. The trench may have a width 119. The ratio of the width 119 of the trench to the width 115 of edge metal line 111 (119:115) may be approximately from 2.1:1 to 100:1, preferably from approximately 2.5:1 to 50:1, more preferably from approximately 3:1 to 30:1, and most preferably from approximately 4:1 to 25:1.

Edge metal lines 110–113 may also be of any suitable length and may be horizontally disposed on substrate 100 so as to horizontally interconnect contacts or other features formed on or in substrate 100.

After step 4d, features 104 and 106 may be removed or left in place. If features 104 and 106 are a dielectric material such as $SiO_2$, they may be left in place to passivate edge metal lines 110–113.

Figure 1A:
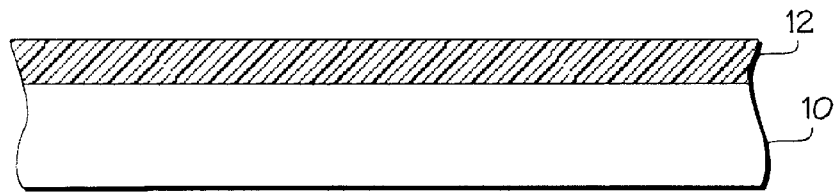
FIGS. 1a–1d are cross sectional views of a conventional process of manufacturing two metal lines.
Figure 1B:
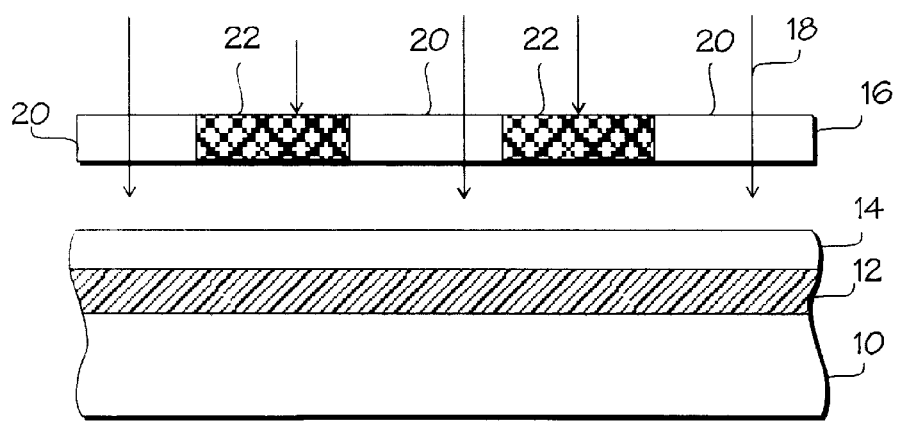
Figure 1C:
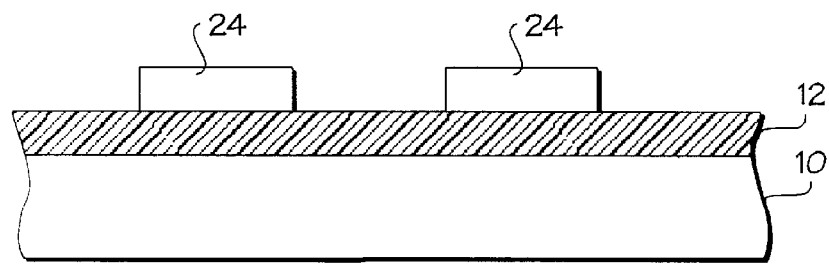
Figure 1D:
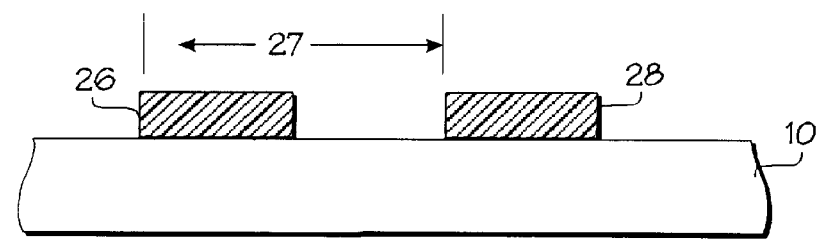
Figure 2:
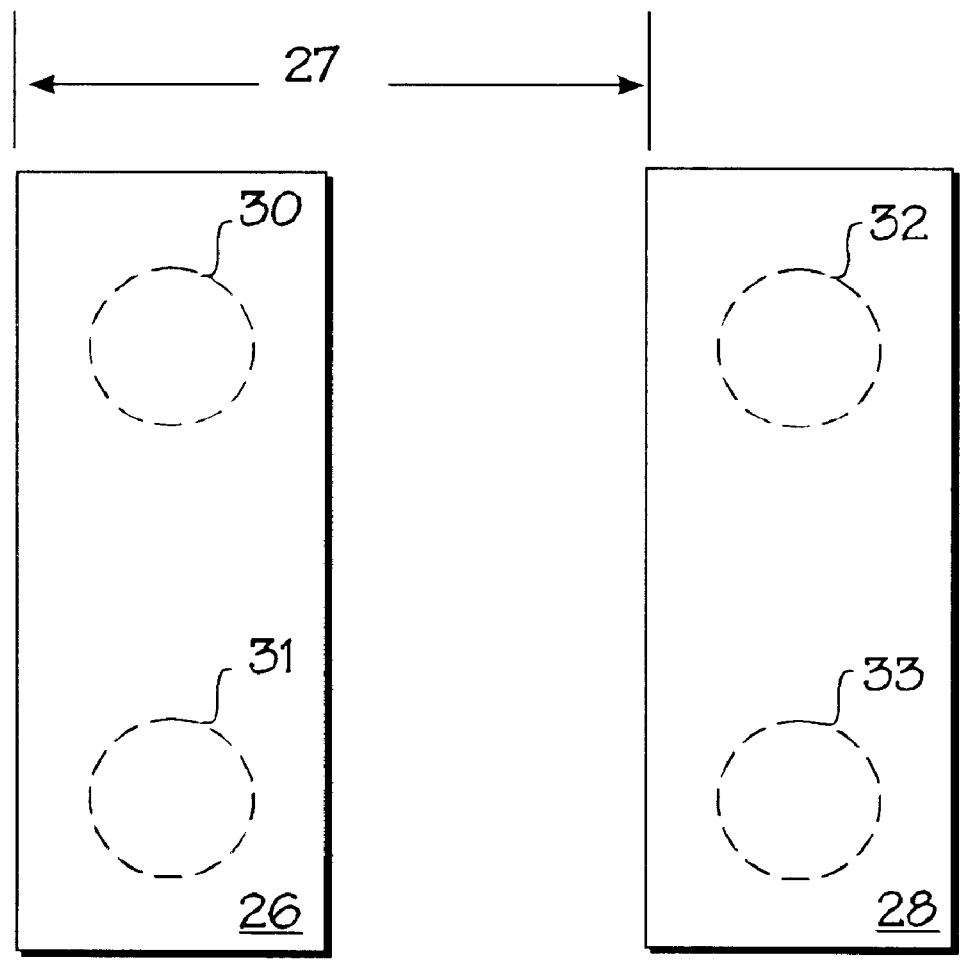
FIG. 2 is a top view of two conventional metal lines formed over contacts.
Figure 3A:
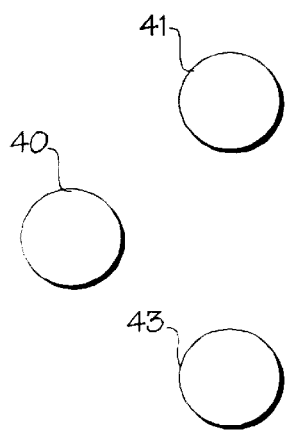
FIGS. 3a–3d are top views of a conventional process of cross-coupling two pairs of contacts.
Figure 3B:
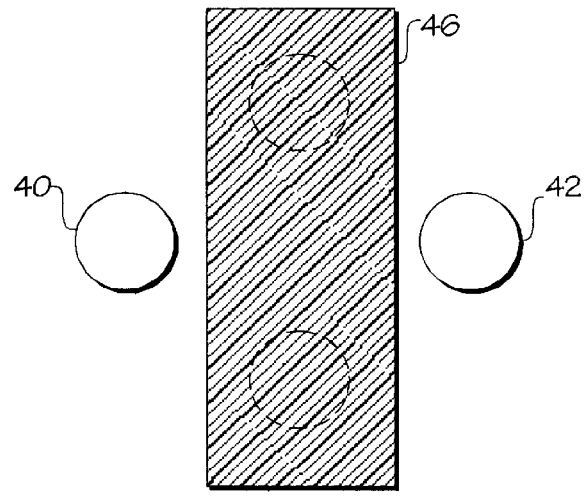
Figure 3C:
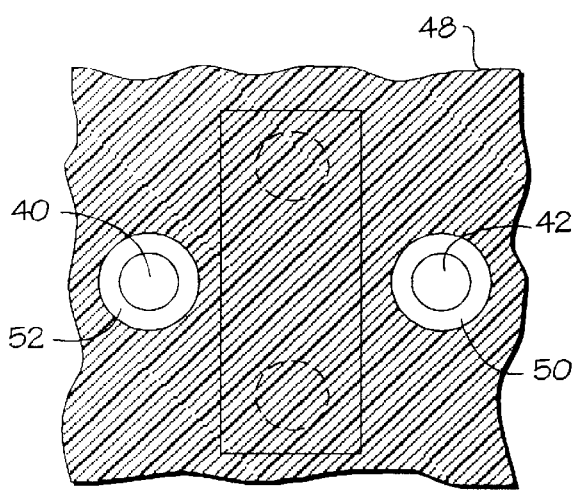
Figure 3D:
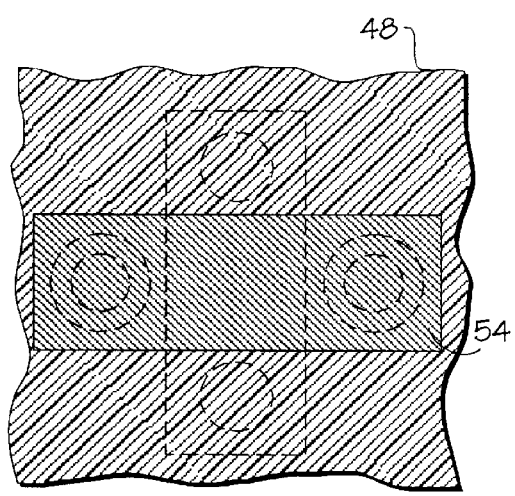

The method of forming edge metal lines illustrated in FIGS. 4a–4d enables more metal lines to be placed in a given area than is possible using conventional lithography processes. For example, the pitch 27 of FIG. 1d is illustrated in FIG. 4d for comparison purposes. As illustrated in FIG. 4d, two edge metal lines 110 and 111 can be placed within distance 27. Therefore, the pitch of edge metal lines 110–113 is approximately one-half of the conventional lithography process. Thus, the use of edge metal lines may enable the doubling of metal line density in a given area of silicon compared with conventional lithography processes of generating metal lines.

The edge metal lines may be used to interconnect contacts or other features. The edge metal lines may be used to horizontally interconnect features or contacts that are formed at various locations on a semiconductor substrate. The edge metal lines utility may be limited by the current carrying capacity of the particular conductive material used to form the edge metal lines. Edge metal lines 110–113 may be formed from low resistance metal (e.g., Al) and used to replace local interconnect lines typically formed of higher resistance types of conductive materials such as TiW. Additionally, as will be discussed in more detail below, edge metal lines may enable multiple layers of interconnect and/or metal lines to be reduced or even replaced with a single layer of edge metal. Thus, fabrication processes may be greatly simplified, resulting in reduced costs and reduced fabrication time. For example, the edge processes illustrated herein may eliminate deposition steps, mask steps, etch steps, and/or planarization steps from a conventional multilayer metal (and/or interconnect) process.

Furthermore, existing or even older process equipment may be used to form edge metal lines that are spaced closer to each other than is possible using the most expensive fabrication machines (e.g., steppers) and conventional lithography processes. Therefore, less expensive fabrication machines may be used to produce edge metal lines without purchasing the latest and most expensive fabrication equipment. Additionally, state of the art fabrication machines may be used to produce edge metal lines that are smaller than conventional metal lines.

Edge metal lines may be used for both logic routing and for interconnecting transistors in memory cells (e.g., SRAM cells).

Figure 19A:
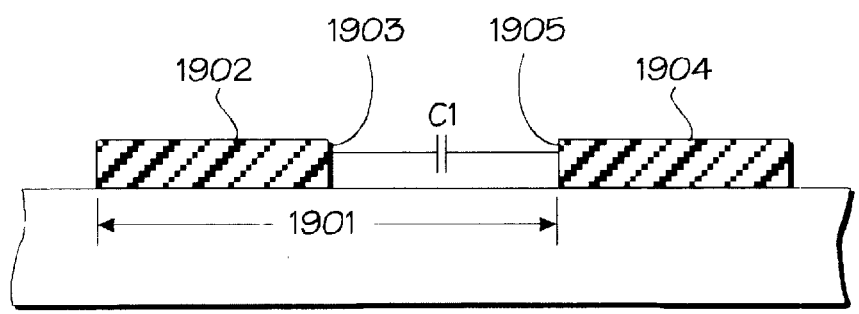
FIG. 19a illustrates sidewall capacitance between two metal lines fabricated by a conventional process.

The sidewall capacitance between metal lines may be significantly reduced by using edge metal lines instead of metal lines formed by conventional techniques. FIG. 19a illustrates metal lines 1902 and 1904 formed by a conventional lithography process. Metal lines 1902 and 1904 may have a pitch 1901. A sidewall capacitance C1 may exist between sidewall 1903 of metal line 1902 and sidewall 1905 of metal line 1904. C1 may increase as metal lines 1902 and 1904 are formed closer together, and may decrease as metal lines 1902 and 1904 are formed farther apart. The minimum spacing between metal lines 1902 and 1904 may result in an undesirably high sidewall capacitance C1 between the metal lines, causing adverse performance effects.

Figure 19B:
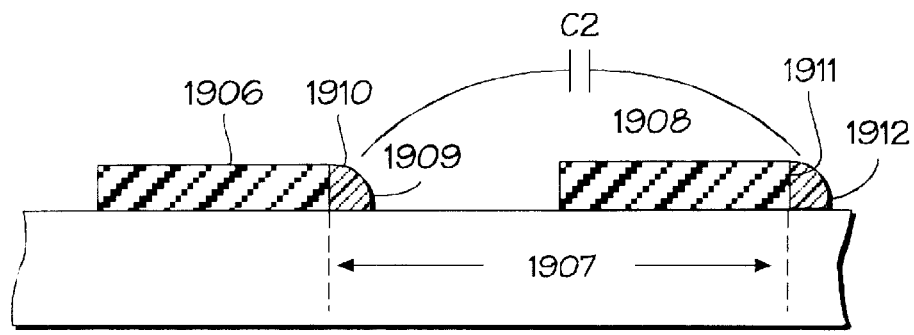
FIG. 19b illustrates sidewall capacitance between two edge metal lines.
Figure 20A:
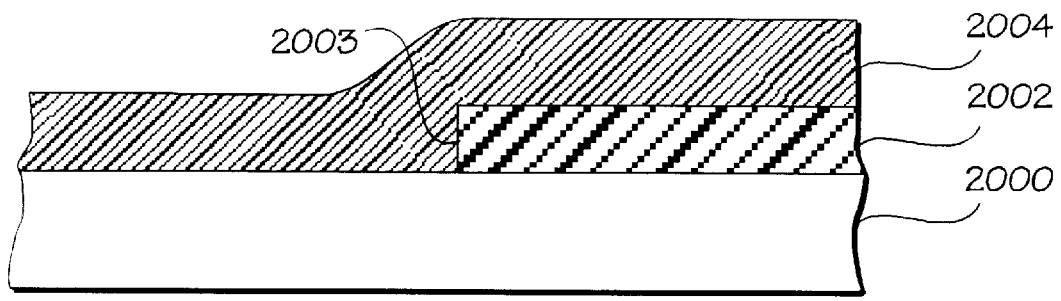
FIGS. 20a and 20b illustrate an undesirable metal stringer between two conventional metal lines.
Figure 20B:
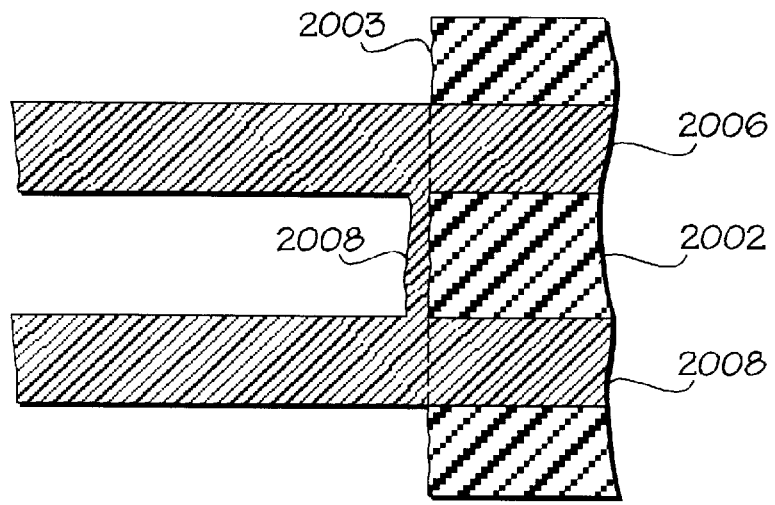

Sidewall capacitance C1 may be significantly reduced or may be rendered negligible with edge metal lines because edge metal lines may be formed farther apart from each other than conventional metal lines while the density of the edge metal lines may be the same or better than conventional metal lines. For example, FIG. 19b shows two edge metal lines 1910 and 1912 formed adjacent to features 1906 and 1908. Edge metal lines 1910 and 1912 may have approximately the same pitch 1907 as metal lines 1902 and 1904; however, the sidewall capacitance C2 between sidewall 1909 of edge metal line 1910 and sidewall 1911 of edge metal line 1912 may be significantly smaller than sidewall capacitance C1. The relatively smaller widths of edge metal lines 1910 and 1912 compared with metal lines 1902 and 1904 may result in the distance between sidewalls 1909 and 1911 being greater than the distance between sidewalls 1903 and 1905. For one embodiment, sidewall capacitance C2 may be approximately zero. In addition, where the edge metal lines have the same or even smaller pitch than conventional metal lines, the shapes of the edge metal lines (e.g., having a relatively more rounded corner along the exposed surface[s]) may also reduce the interline capacitance to an acceptably low level relative to conventional metal lines.

FIGS. 5a–5d illustrate a cross sectional view of one application of the method of FIGS. 4a–4d wherein the edge metal lines may be used to electrically interconnect contacts formed in an insulating layer. FIGS. 6a–6d illustrate top views of the FIGS. 5a–5d.

Figure 5A:
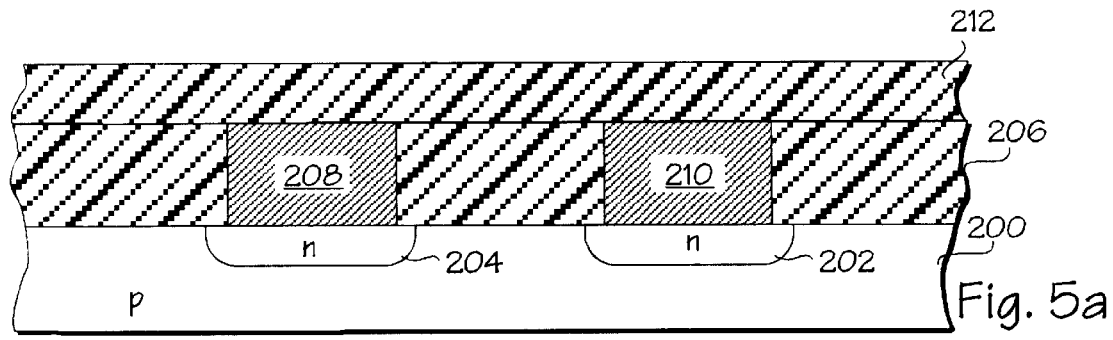
FIGS. 5a–5d are cross sectional views of one embodiment of forming edge metal lines over contacts.

FIG. 5a illustrates a p-type substrate 200 having n-wells 204 and 202. P-type substrate 200 may alternatively comprise an n-type substrate. N-wells 202 and 204 may alternatively comprise p-wells. N-wells 202 and 204 may be source or drain regions of a MOSFET transistor. FIG. 5a further illustrates a dielectric layer 206 formed over the p-type substrate 200. For one embodiment, dielectric layer 206 may comprise $SiO_2$. Dielectric layer 206 includes contacts 208 and 210 formed over n-wells 204 and 202, respectively. Contacts 208 and 210 may also be referred to as "plugs" or "nails." Contacts 208 and 210 may be used to interconnect n-wells 202 and 204 to another layer. Contacts 208 and 210 may include any suitable conductive material formed to any suitable thickness using any suitable technique. The formation of contacts and the materials used to form contacts are well known in the art, and are therefore not discussed in detail herein. For one embodiment, contacts 208 and 210 may comprise tungsten.

Figure 5B:
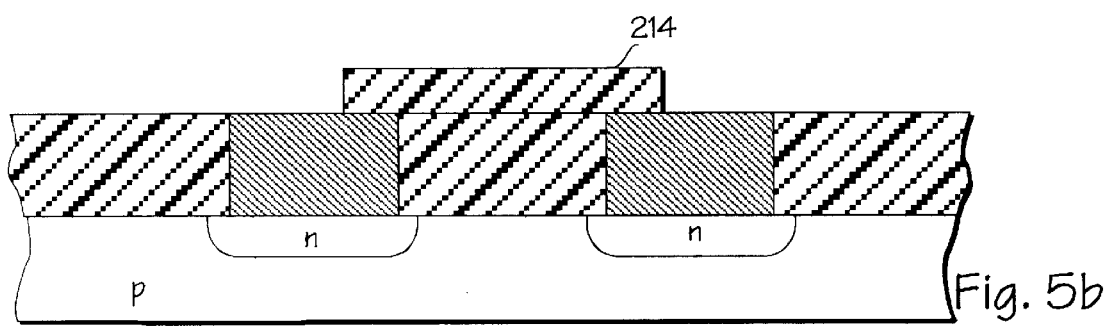
Figure 5C:
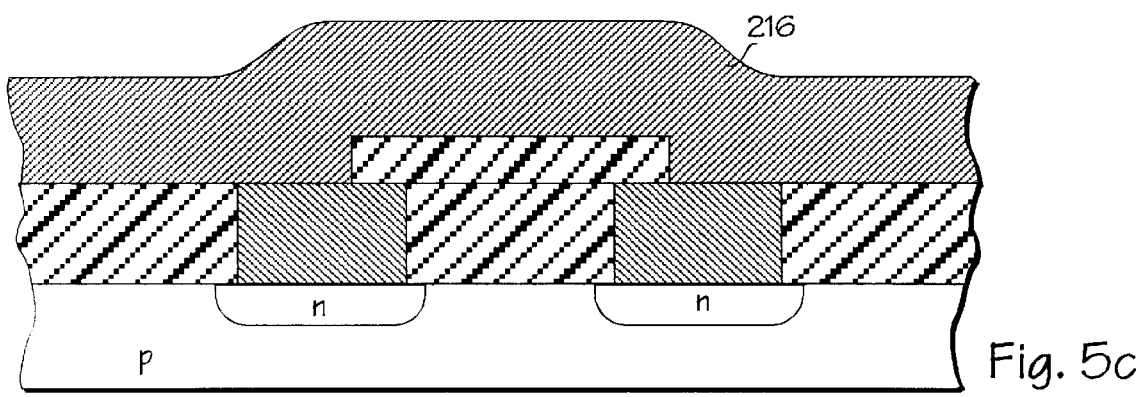
Figure 5D:
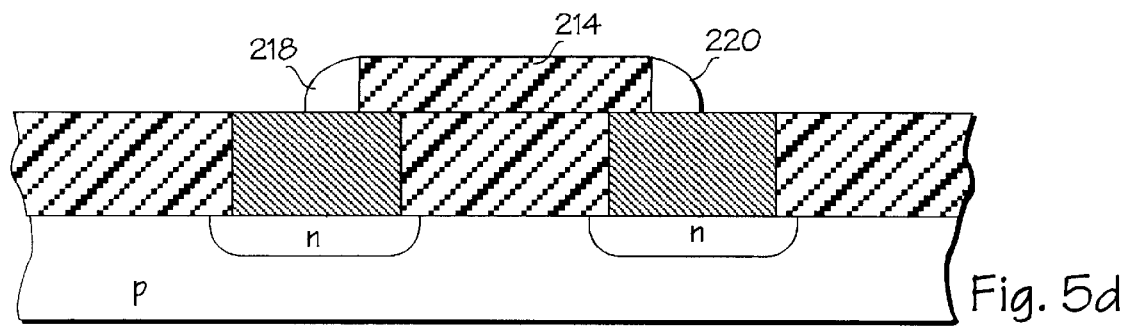
Figure 6A:
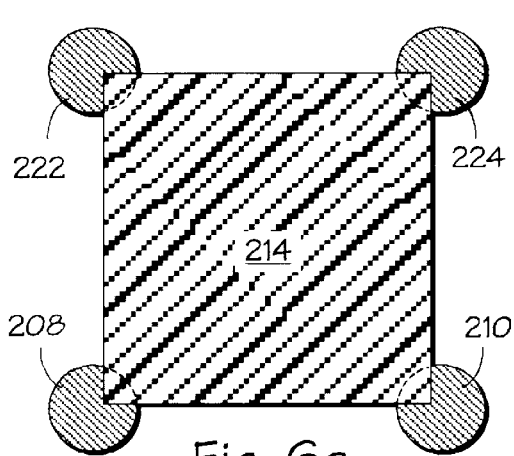
FIGS. 6a–6d are top views of the process illustrated in FIGS. 5a–5d.

Edge metal lines 218 and 220, illustrated in FIG. 5d, are formed in a similar manner as edge metal lines 110–113 illustrated in FIG. 4d. Insulating layer 212 is formed over dielectric layer 206 and contacts 208 and 210 as illustrated in FIG. 5a. Insulating layer 212 is then patterned to form feature 214 as illustrated in FIGS. 5b and 6a. FIG. 6a does not illustrate n-wells 202 and 204, and dielectric layer 206 so as not to obscure the teaching of the illustration. Furthermore, FIG. 6a illustrates two more contacts 222 and 224 in insulating layer 206.

Figure 6B:
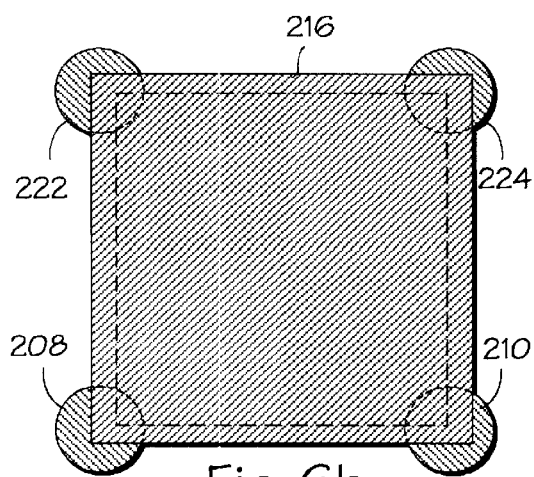
Figure 6C:
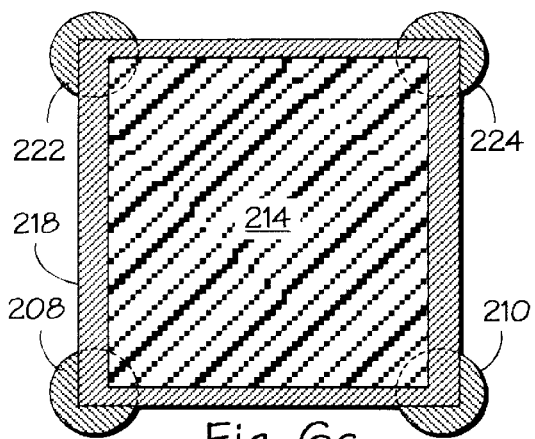

Conductive layer 216 may then be formed over feature 214, contacts 208, 210, 222, and 224, and dielectric layer 206 as illustrated in FIGS. 5c and 6b. Conductive layer 216 may then be anisotropically etched to form edge metal lines 218 and 220 as illustrated in FIGS. 5d and 6c. Edge metal lines 218 and 220 may be electrically connected to, and horizontally disposed over, contacts 208, 210, 222 and 224. FIG. 6c shows that edge metal lines 218 and 220 may be the same edge metal line formed in an annular shape about the sidewalls of feature 214. FIG. 6c further illustrates that the edge metal may electrically interconnect contacts 208, 210, 222, and 224 to each other.

Figure 6D:
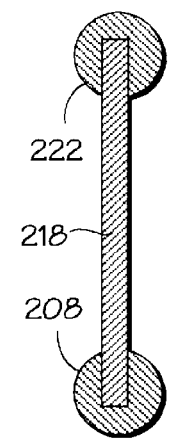
Figure 6D:
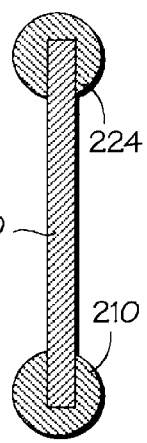

The edge metal interconnections between contacts 208, 210, 222, and 224 may be selectively removed by a lithography process. For example, the interconnection between contacts 222 and 224, and the interconnection between contacts 208 and 210 may be removed by using a "cut" mask over the regions between the pairs of contacts, as illustrated in FIG. 6d. Portions of feature 214 and the edge metal line may be removed, or only portions of the edge metal line may be removed. Other interconnections between contacts 208, 210, 222, and 224 may also be selectively removed. Edge metal lines may also enable contacts, such as contacts 222 and 224, to be formed closer to each other than is currently possible.

Figure 7:
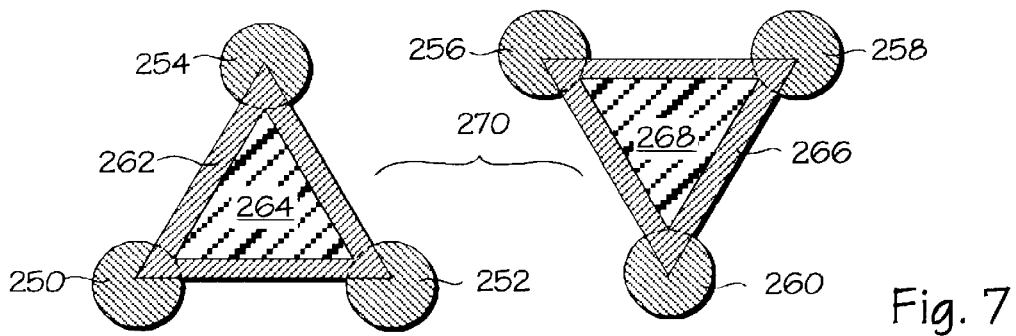
FIG. 7 is a top view of another embodiment using edge metal to interconnect contacts.

FIG. 7 illustrates another embodiment of the edge metal process for interconnecting contacts. FIG. 7 illustrates that contacts do not have to be manufactured as if located at the intersections of a grid pattern; rather, the contacts may be arranged in substantially any configuration.

FIG. 7 illustrates contacts 250, 252, and 254 arranged in a first triangle pattern and interconnected by edge metal 262 formed adjacent to the sidewalls of feature 264. Edge metal 262 may be formed in a manner similar to that illustrated in FIGS. 5a–5d and/or FIGS. 6a–6d. Similarly, FIG. 7 illustrates contacts 256, 258, and 260 arranged in a second triangle pattern and interconnected by edge metal 266 formed adjacent to the sidewalls of feature 268. Edge metal 266 may also be formed in a manner similar to that illustrated in FIGS. 5a–5d and/or FIGS. 6a–6d.

Edge metal lines 262 and 266 may be separated by a distance 270 which may be significantly less than the pitch 27 illustrated in FIG. 1d. The distance 270 may be limited only by the spacing of the contacts 252, 254, 256, 260, or the spacing of features 264 and 266.

FIGS. 8a–8d illustrate a three-dimensional view of an alternative embodiment of forming edge metal lines that may be used to interconnect features of a semiconductor device. FIGS. 9a–9b further illustrate a top view of one embodiment of FIG. 8d.

Figure 8A:
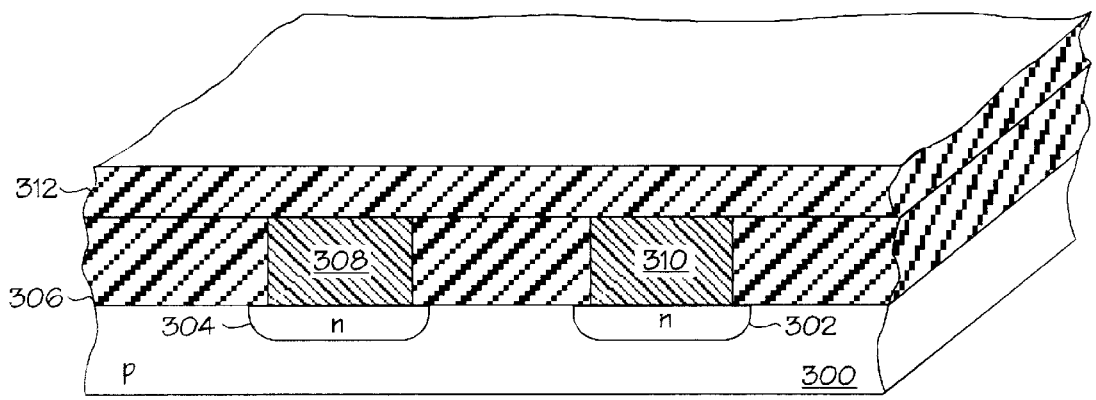
FIGS. 8a–8d are three-dimensional views of another embodiment of forming edge metal lines over contacts.
Figure 9A:
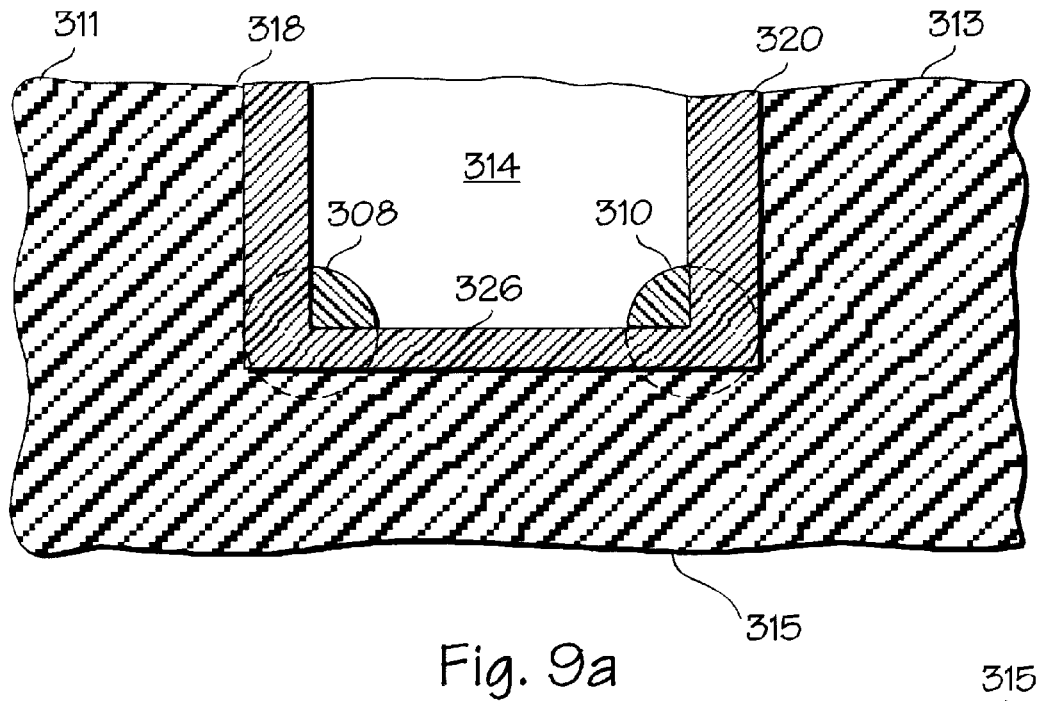
FIGS. 9a–9b are top views of FIGS. 8a–8d.
Figure 9B:
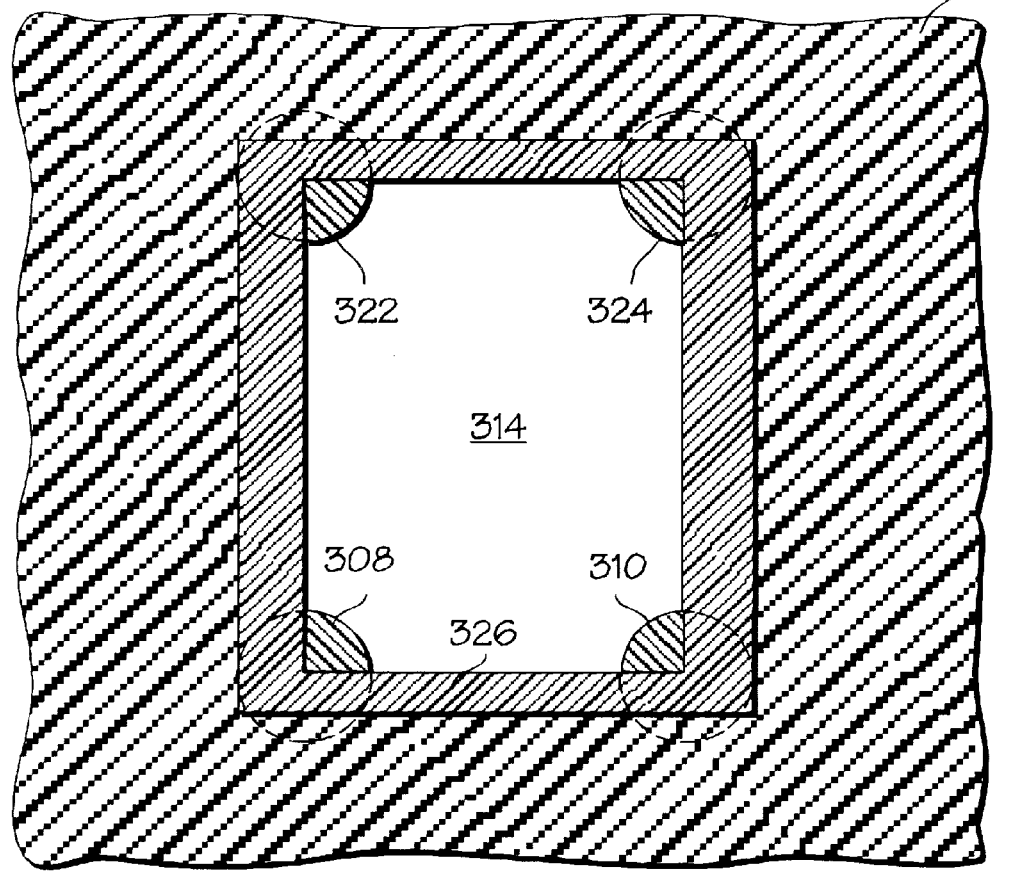

FIG. 8a illustrates a p-type substrate 300 having n-wells 304 and 302. P-type substrate 300 may alternatively comprise an n-type substrate. N-wells 302 and 304 may alternatively comprise p-wells. N-wells 302 and 304 may be source or drain regions of a MOSFET transistor. FIG. 8a further illustrates a dielectric layer 306 formed over the p-type substrate 300. For one embodiment, dielectric layer 306 may comprise $SiO_2$. Dielectric layer 306 includes contacts 308 and 310 formed over n-wells 308 and 310, respectively. Contacts 308 and 310 may also be referred to as "plugs" or "nails." Contacts 308 and 310 may be used to interconnect n-wells 302 and 304 to another layer. Contacts 308 and 310 may include any suitable conductive material formed to any suitable thickness using any suitable technique. For one embodiment, contacts 308 and 310 may comprise tungsten.

Figure 8B:
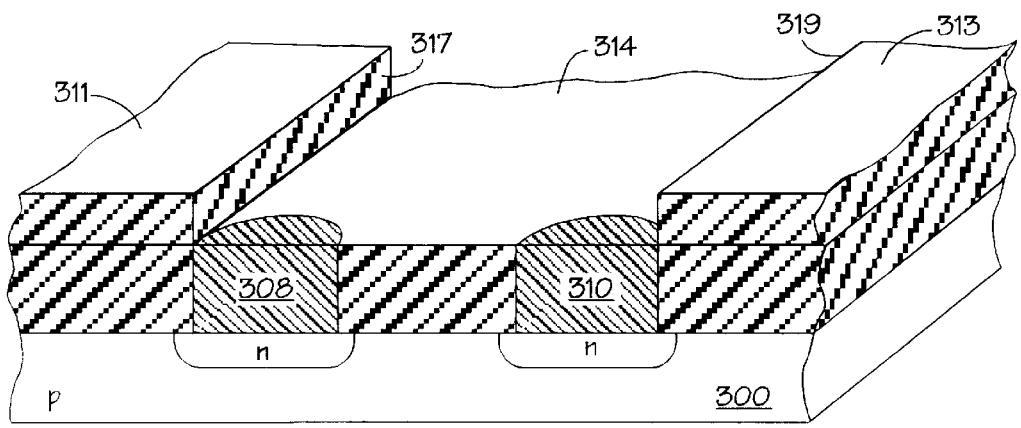

Insulating layer 312 is formed over dielectric layer 306 and contacts 308 and 310 as illustrated in FIG. 8a. Insulating layer 312 is then patterned (e.g., using a "trench mask" and etch process) to form a trench 314, feature 311 having a sidewall 317, and feature 313 having a sidewall 319, as illustrated in FIG. 8b. Trench 314 may also be considered a feature having sidewalls 317 and 319. Trench 314 exposes contacts 308 and 310. Features 311 and 313 may comprise separate unconnected portions of insulating layer 312, or they may be connected and form feature 315 as illustrated in FIG. 9b.

Figure 8C:
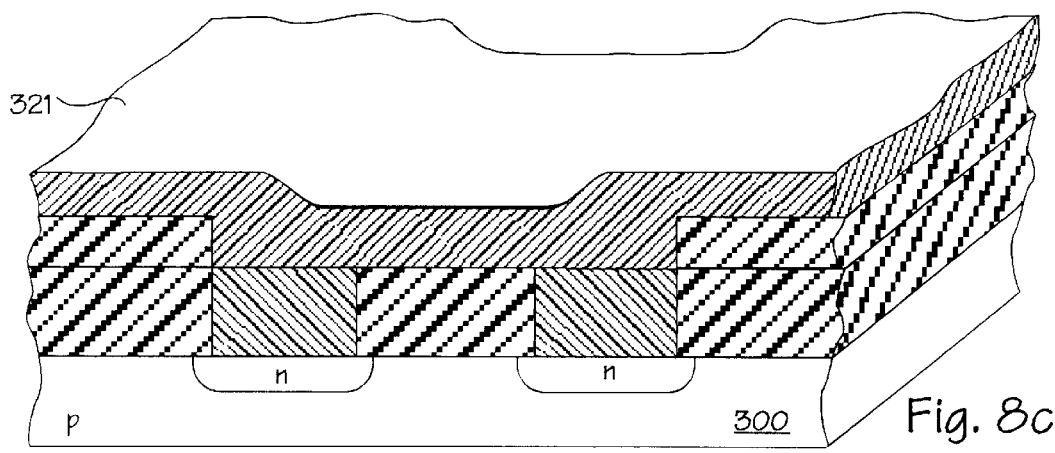

As illustrated in FIG. 8c, a conductive layer 321 may then be formed over feature 311, feature 313, trench 314, and contacts 308 and 310. Conductive layer 321 may be formed from any suitable conductive material of any suitable thickness using any suitable technique. Conductive layer 321 may include Al, Cu, Ti, W, or any combination thereof. Conductive layer may also include other conductive materials or metals.

Figure 8D:
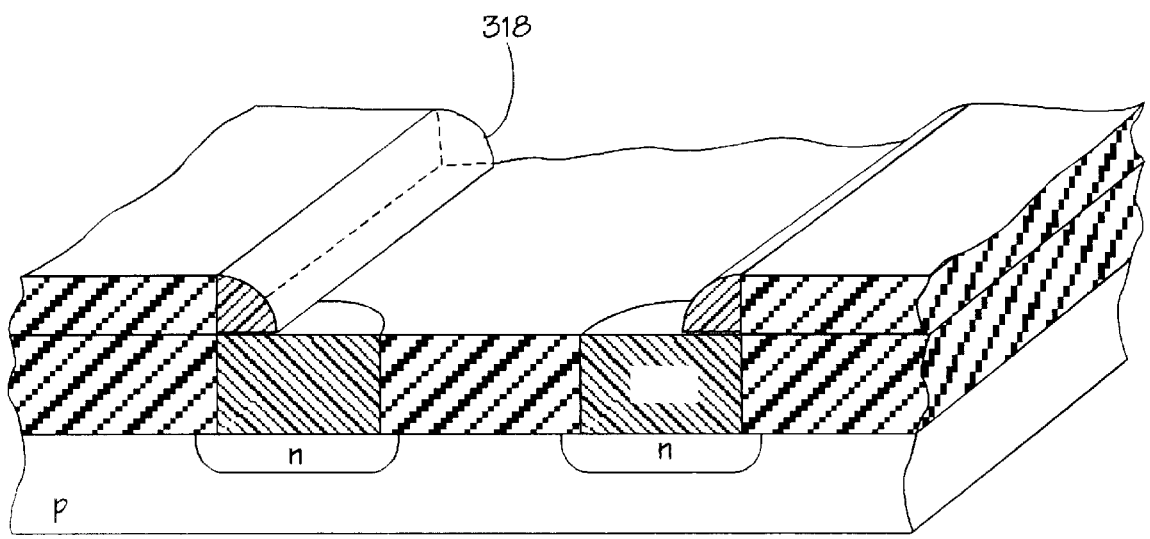

Conductive layer 321 may then be anisotropically etched to form edge metal lines 318 and 320 electrically connected to, and horizontally disposed over, contacts 308 and 310, respectively, as illustrated in FIG. 8d. Alternatively, a photoresist mask may be used prior to etching conductive layer 321. This alternative embodiment may be used, for example, when chlorine is used to etch conductive layer 321 as discussed previously with respect to FIGS. 4a–4d and FIGS. 5a–5d.

Therefore, edge metal lines 318 and 320 may be formed adjacent to sidewalls 317 and 319 of trench 314. Alternatively, edge metal lines 318 and 320 may be viewed as formed adjacent to sidewall 317 of feature 311, and adjacent to sidewall 319 of feature 313.

Edge metal lines 318 and 320 may be horizontally disposed over contacts 308 and 310 and may be used to horizontally electrically interconnect contacts 308 and 310 to another contact or feature. Edge metal lines 318 and 320 may also be the same edge metal line formed in an annular shape within trench 314 as illustrated by edge metal line 326 in FIG. 9a. FIG. 9a further illustrates that contacts 308 and 310 may be interconnected by edge metal line 326.

FIG. 9b illustrates that edge metal line 326 may be used to interconnect any number of contacts exposed in trench 314. For example, four contacts 308, 310, 322, 324 may be interconnected with edge metal line 326 formed in trench 314 as illustrated in FIG. 9b. After edge metal line 326 has been formed, portions of edge metal line 326 may be removed (e.g., through the use of a "cut" mask and etch) to selectively interconnect the various contacts.

Figure 10A:
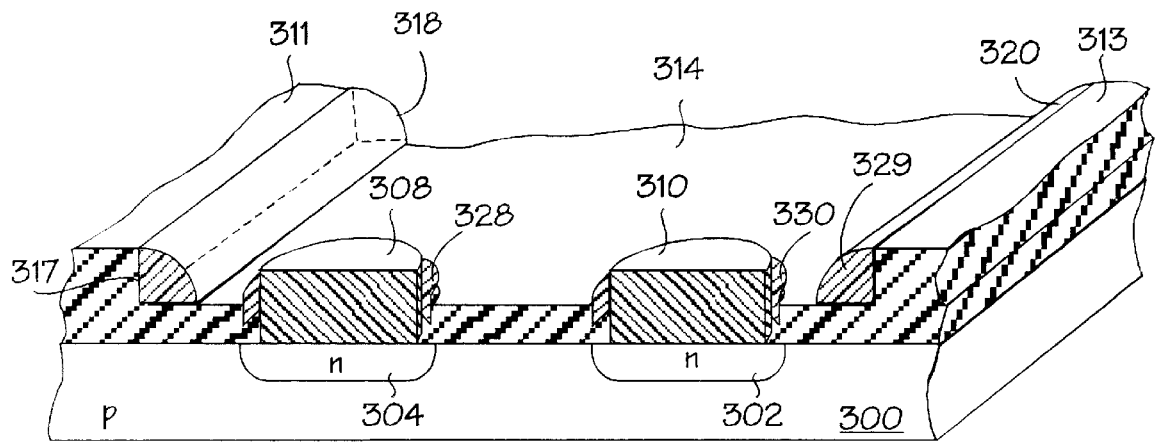
FIG. 10a is a three-dimensional view of one method of forming edge metal lines around contacts.
Figure 10B:
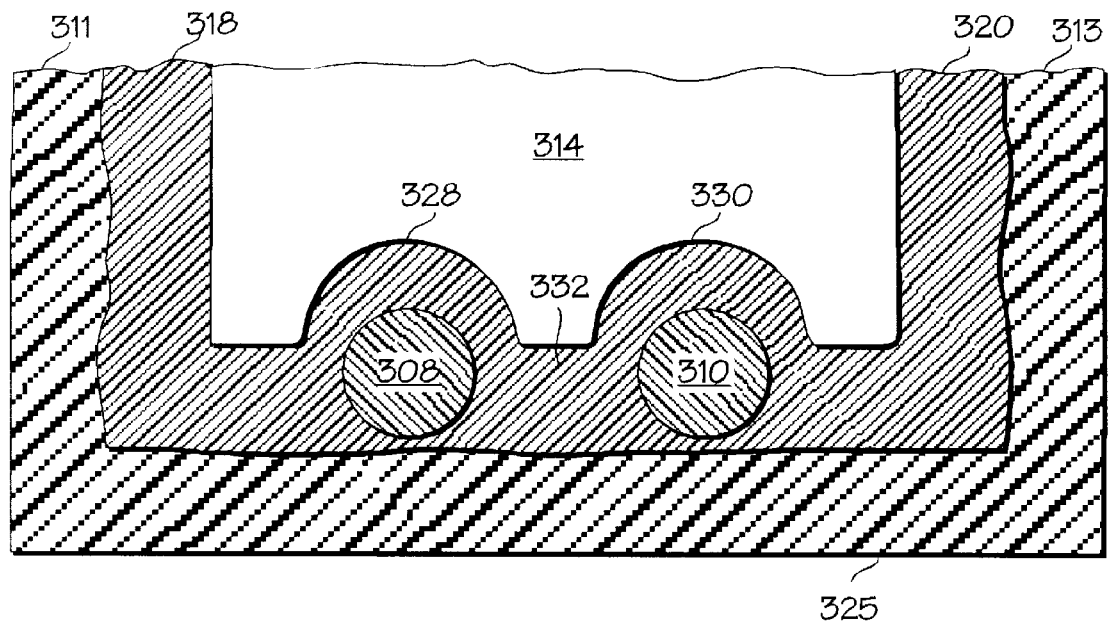

FIGS. 10a–10b illustrate another embodiment of FIGS. 8a–8c. FIG. 10a illustrates that trench 314 may be formed in dielectric layer 306 (without forming insulating layer 312 over dielectric layer 306) to form features 311 and 313 in dielectric layer 306. Trench 314 may have sidewalls 327 and 329. Alternatively, feature 311 may be viewed as having sidewall 327, and feature 313 may be viewed as having sidewall 329. Trench 314 may extend to substrate 300, or may be of any other depth. Trench 314 exposes a portion of the sidewalls of contacts 308 and 310.

A conductive layer may be deposited over feature 311, feature 313, trench 314, and contacts 308 and 310. The conductive layer may then be subjected to an anisotropic etch to form edge metal lines 318, 320, 328, and 330. Edge metal lines 318 and 320 may be formed adjacent to sidewalls 327 and 330, respectively. Edge metal lines 328 and 330 may be formed adjacent to the sidewalls of contacts 308 and 310, respectively, as illustrated in FIG. 10a.

FIG. 10b shows one embodiment of a top view of FIG. 10a. Features 311 and 313 may form one feature 325. Similarly, edge metal lines 318, 320, 328, and 330 may form one edge metal line 332 that may horizontally interconnect contacts 308 and 310. Selective portions of edge metal line 332 may then be removed using, for example, a "cut" mask and etch process.

Although FIGS. 10a–10b illustrate two contacts 308 and 310, the embodiments illustrated in FIGS. 10a–10b may also be used to form a trench and edge metal line or lines around a single contact, or around more than two contacts.

Edge metal lines may be used to interconnect features (e.g., contacts) in one layer of metal in approximately the same amount of silicon area as devices requiring multiple layers of interconnect and/or metal layers.

For example, one layer of edge metal may be used to interconnect cross-coupled contacts in approximately the same amount of silicon area as that used by multiple layers of interconnect (i.e., FIGS. 3a–3d). FIGS. 11a–11d illustrate one such embodiment. FIGS. 11a–11d comprise one application of the method of forming edge metal lines previously discussed in FIGS. 8a–8c. The other embodiments of forming edge metal lines discussed herein may also be used to cross-couple contacts.

Figure 11A:
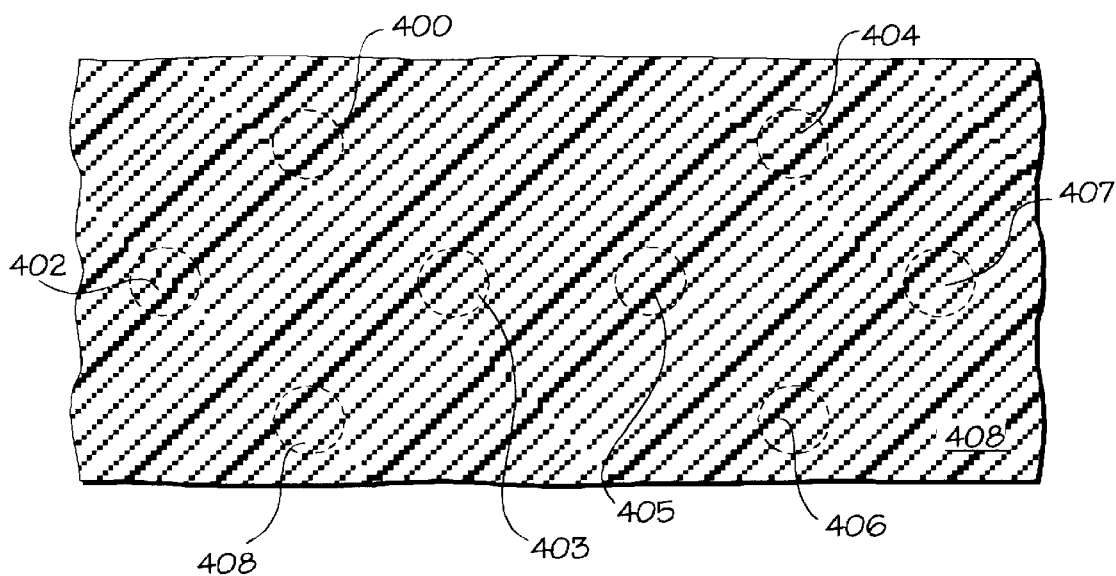
FIGS. 11a–11d are top views of one embodiment of cross-coupling contacts using edge metal lines without using multiple layers of interconnect.

FIG. 11a shows two groups of contacts. The first group includes contacts 400–403, and the second group includes contacts 404–407. Contacts 400–407 may comprise any type of conductive material including tungsten. Contacts 400–407 may be formed in a dielectric layer (not shown) including $SiO_2$. Contacts 402, 403, 405, and 407 may lie along a first horizontal axis. Contacts 400 and 401 may lie along a second horizontal axis. The first axis may intersect the second axis at a point between contacts 402 and 403 and at a point between contacts 400 and 401.

As illustrated in FIG. 11a, an insulating layer 408 may be formed over contacts 400–407. Insulating layer 408 may be any suitable material of any suitable thickness formed by any suitable means. For one embodiment, insulating layer 408 comprises an oxide layer (e.g., $SiO_2$).

Figure 11B:
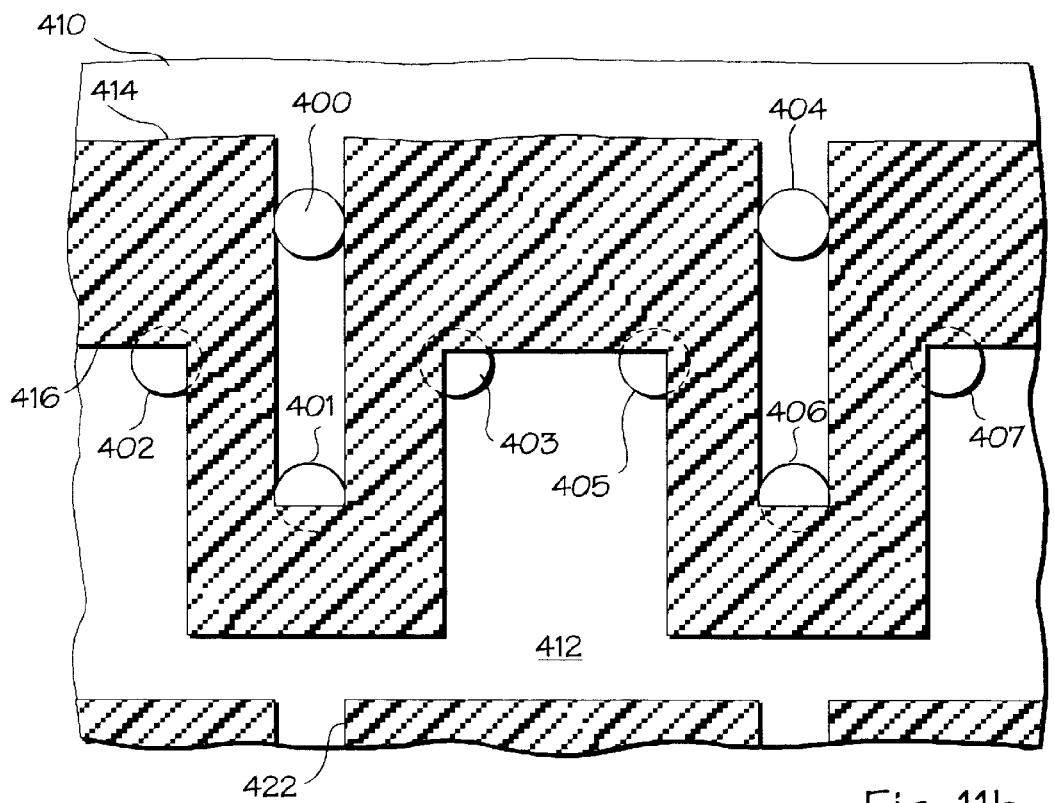

FIG. 11b illustrates that trenches 410 and 412 may then be formed in insulating layer 408. Trench 410 may have a sidewall 414 and expose contacts 400, 401, 404, and 406. Trench 412 may have sidewalls 416 and 422 and expose contacts 402, 403, 405, and 407. Sidewalls 416 and 422 may be the same sidewall.

Figure 11C:
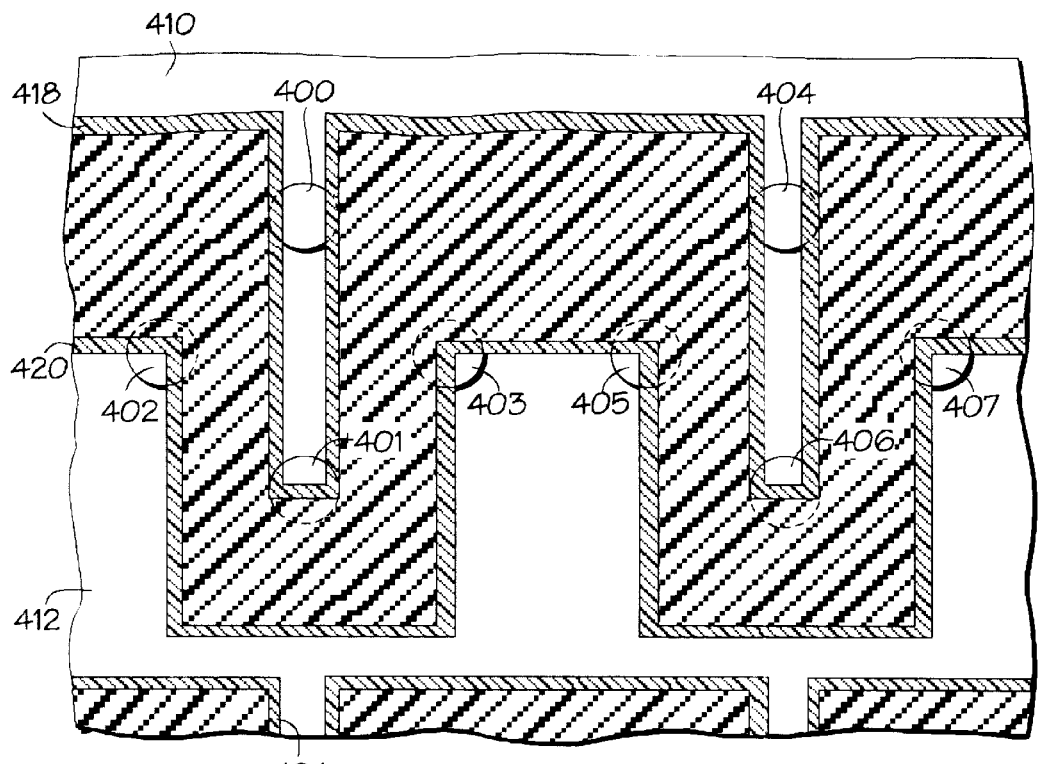

A conductive layer may then be formed over insulating layer 408 and trenches 410 and 412. The conductive layer may be any suitable conductive material of any suitable thickness and deposited in any suitable manner. The conductive layer may include Al, Cu, Ti, W, or any combination thereof. As illustrated in FIG. 11c, the conductive layer may then be anisotropically etched to form edge metal line 418 adjacent to sidewall 414 of trench 410, edge metal line 420 adjacent to sidewall 416 of trench 412, and edge metal line 424 adjacent to sidewall 422 of trench 412. Edge metal lines 420 and 424 may be the same edge metal line.

Edge metal line 420 interconnects contacts 402, 403, 405, 407. Edge metal line 418 interconnects contacts 400, 401, 404, and 406. Edge metal line 418 is illustrated in FIG. 11c as not completely covering contacts 400, 401, 404 and 406. In an alternative embodiment, edge metal line 418 may completely cover contacts 400, 401, 404, and 406.

Figure 11D:
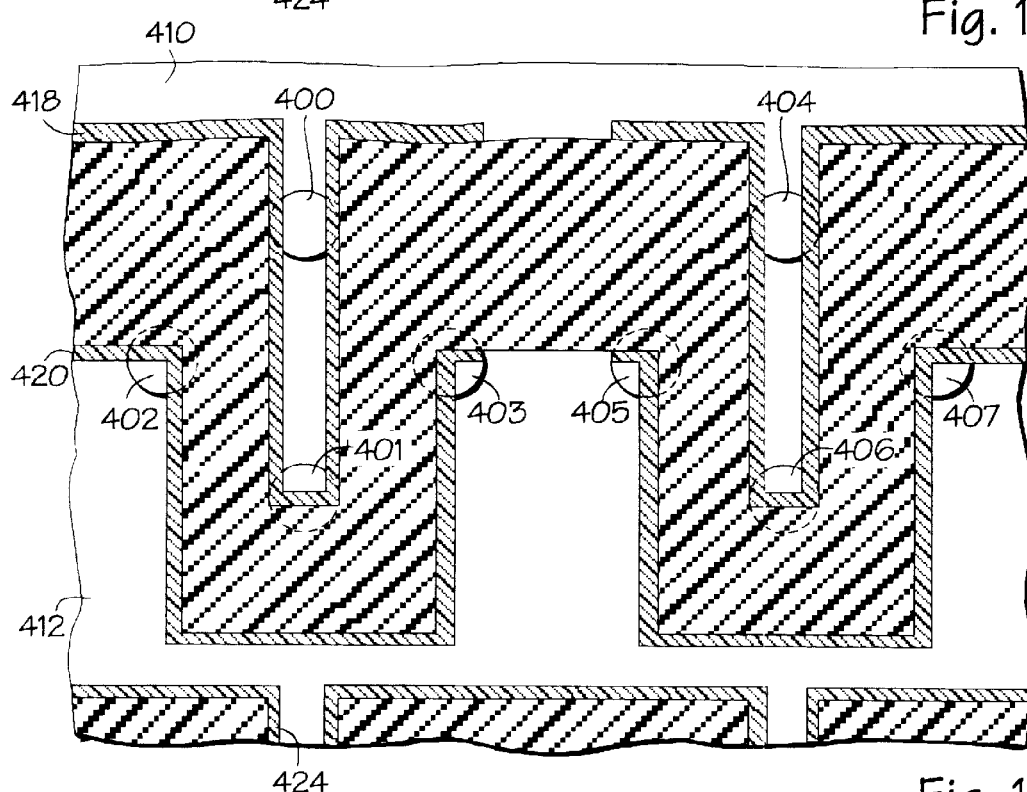

As illustrated in FIG. 11d, a portion or portions of edge metal line 420 may be selectively removed (e.g., through the use of a "cut" mask and etch process) to disconnect contact 403 from contact 405. Similarly, a portion or portions of edge metal line 418 may be selectively removed to disconnect contacts 400 and 401 from 404 and 406. Additionally, a portion or portions of edge metal line 424 may be removed.

FIGS. 11a–11d illustrate that one layer of edge metal may be used to interconnect contacts that are conventionally cross-coupled with multiple layers of interconnect and/or metal lines. This may be accomplished with only one layer of edge metal and may be accomplished in approximately the same area (or less) of silicon used by conventional multiple layer schemes, and in approximately half the area of cross-coupling contacts using one layer of standard metal lines. For example, the conventional cross-couple multi-layer process illustrated in FIGS. 3a–3d may have a size of approximately 9.3 square microns. In contrast, cross coupling similar sized contacts using one layer of edge metal lines may result in an otherwise identical cell having a size of approximately 7.0 square microns. As the dimensions shrink in succeeding generations of technology the size of a cell having such cross coupled contacts (e.g., 6-transistor or 4-transistor, 2-resistor SRAM cell) using one layer of edge metal may range from approximately 2.0 to 30.0 square microns, preferably from approximately 2.5 to 20 square microns, more preferably from approximately 2.5 to 15.0 square microns, and most preferably from approximately 2.5 to 14.0 square microns.

Edge metal lines may also be formed in the same layer of conductive material as a standard metal line. This may be useful in a process that may need the small size of the edge metal, but also may need wider metal lines that have higher current carrying capacities.

FIGS. 12a–12e illustrate one embodiment of forming an edge metal line and a standard or "bus" metal line from the same layer of conductive material. The process illustrated in FIGS. 12a–12e may be referred to as "mixed-mode metal" because it may produce two type of metal lines: edge metal lines, and standard metal lines. As will be described in more detail below, the process of FIGS. 12a–12e may also be used to form a third metal line which may be termed a "pseudo-damascene" metal line in addition to an edge metal line and a standard metal line. Additionally, the process illustrated in FIGS. 12a–12e may also form a contact from the same conductive layer used to form the edge metal line, the standard metal line, and/or the pseudo-damascene metal line.

Figure 12A:
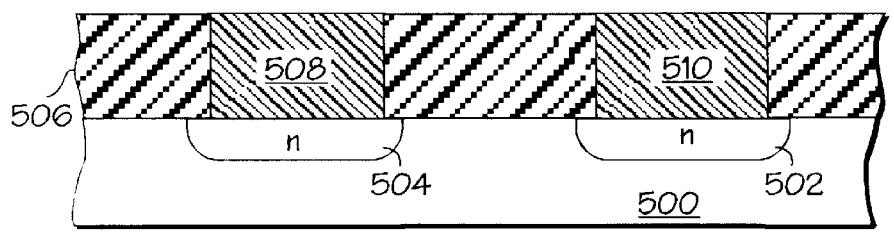
FIGS. 12a–12e are cross sectional views of one embodiment of forming an edge metal line and a bus metal line from the same layer of metal.

FIG. 12a illustrates a p-type substrate 500 having n-wells 504 and 502. P-type substrate 500 may alternatively comprise an n-type substrate. N-wells 502 and 504 may alternatively comprise p-wells. N-wells 502 and 504 may be source or drain regions of a MOSFET transistor. FIG. 12a further illustrates a dielectric layer 506 formed over the p-type substrate 500. For one embodiment, dielectric layer 506 may comprise $SiO_2$. Dielectric layer 506 includes contacts 508 and 510 formed over n-wells 502 and 502, respectively. Contacts 508 and 510 may be used to interconnect n-wells 502 and 504 to another layer. Contacts 508 and 510 may include any suitable conductive material formed to any suitable thickness using any suitable technique. For one embodiment, contacts 508 and 510 may comprise tungsten.

Figure 12B:
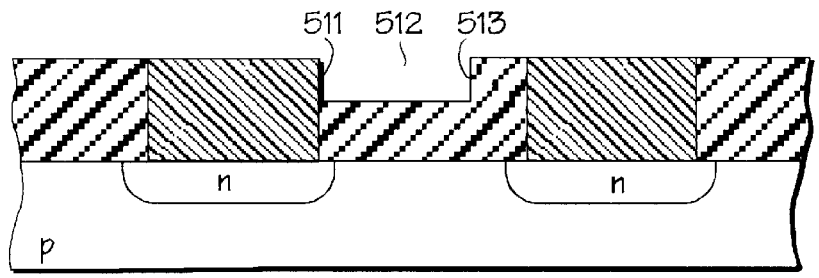

As illustrated in FIG. 12b, trench 512 may be formed in dielectric layer 506. Trench 512 may have any suitable depth. For one embodiment, trench 512 may have a depth of from approximately 1000 Angstroms to 10,000 Angstroms, preferably 2000 Angstroms to 8000 Angstroms. For one embodiment, the trench is about 4000 Angstroms deep. Trench 512 has sidewalls 511 and 513. Trench 512 may have one sidewall coincident with a sidewall of contact 508 as illustrated in FIG. 12b. For another embodiment, sidewalls 511 and 513 of trench 512 may not be coincident with either of contacts 508 or 510.

Figure 12C:
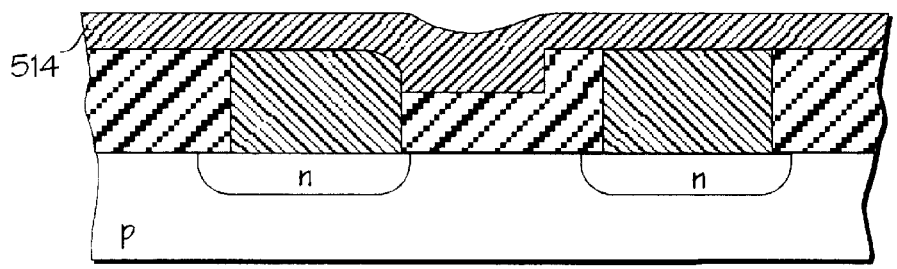
Figure 12D:
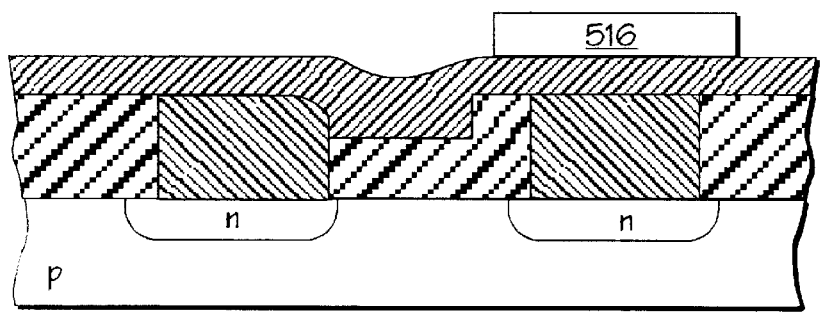

As illustrated in FIG. 12c, a conductive layer 514 may then be formed over dielectric layer 506, trench 512, and contacts 508 and 510. Conductive layer may be any suitable conductive material of any suitable thickness deposited in any suitable manner. For one embodiment, conductive layer 514 includes Al, Cu, Ti, W, or any combination thereof.

An imaging layer may then be deposited over conductive layer 514 and patterned to form feature 516 over contact 510. Imaging layer 516 may include a suitable positive photoresist, a suitable negative photoresist, a suitable radiation-sensitive polyimide, or other suitable radiation sensitive materials.

Figure 12E:
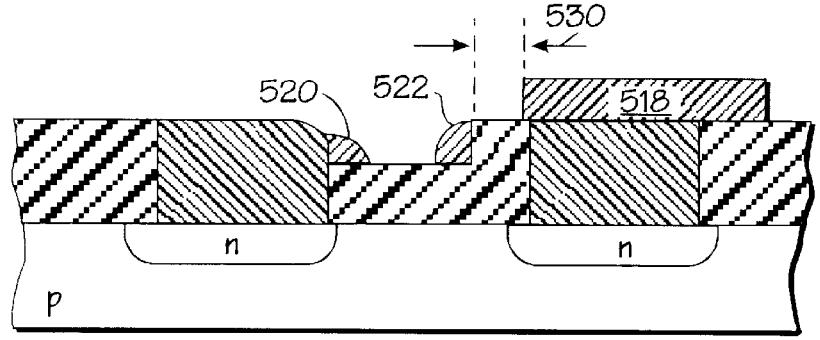

As illustrated in FIG. 12e, conductive layer 514 may then be anisotropically etched to form standard metal or bus line 518, and edge metal lines 520 and 522. Alternatively, a photoresist mask may be used prior to etching conductive layer 514. This alternative embodiment may be used, for example, when chlorine is used to etch conductive layer 514 as discussed previously with respect to FIGS. 4a–4d and FIGS. 5a–5d.

Feature 516 may then be removed. Edge metal line 520 may be formed adjacent to sidewall 511, and edge metal line 522 may be formed adjacent to sidewall 513. Edge metal lines 520 and 522 may be the same edge metal line formed in an annular shape within trench 512 bounded by sidewalls 511 and 513.

For another embodiment, bus line 518 may be formed inside of trench 512 between sidewalls 511 and 513.

Edge metal lines 520 and 522 may be horizontally disposed within trench 512 and may horizontally interconnect various contacts or features formed on substrate 500. Bus line 518 may be horizontally disposed over contact 510 and may horizontally interconnect various contacts or features formed on substrate 500.

FIGS. 12a–12e illustrates that one layer of conductive material may be patterned to form an edge metal line and a standard metal line. As further illustrated in FIGS. 12a–12e, edge metal line 522 may be formed a distance 530 from bus line 518. The distance 530 is not limited by the pitch of features on a metal mask, a lens, or other conventional lithography equipment relating to a single level of lithography. The distance 530 may be any distance and may be limited only by an alignment tolerance. For example, 530 may be from approximately 0.10 $\mu$m to 5.0 $\mu$m, more preferably from approximately 0.12 $\mu$m to 2.5 $\mu$m, and most preferably from 0.20 $\mu$m to 1.0 $\mu$m. For one embodiment, the distance 530 is about 0.20 $\mu$m.

The process illustrated in FIGS. 12a–12e may be used to manufacture devices that may benefit from the space and layer saving advantages of edge metal lines, and that also require a larger bus metal line for higher current capacity signals. For example, the process of FIGS. 12a–12e may be used to manufacture a memory cell, wherein edge metal lines 520 and 522 may be used, for example, to interconnect transistors (e.g., source and drain regions of MOSFET transistors), and bus line 518 may be used, for example, for power lines (e.g., VCC and VSS lines). The process illustrated in FIGS. 12a–12e may reduce the number of interconnect or metal layers required to form a memory cell and may do so without increasing the silicon area occupied by the memory cell. Therefore, memory cells may be manufactured at substantially lower costs relative to previous methods of fabricating a memory cell.

Figure 13:
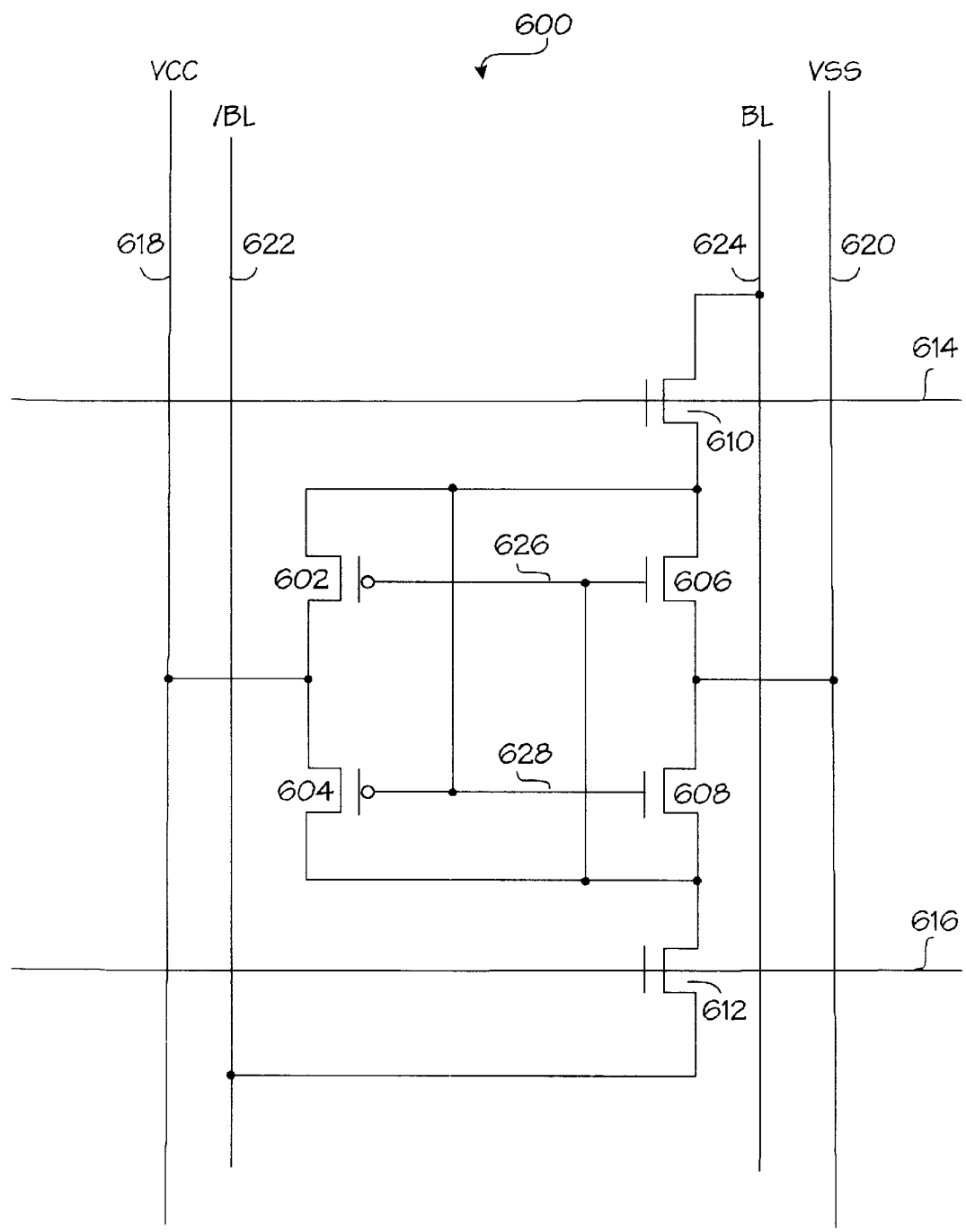
FIG. 13 is a circuit diagram of a static random access memory device (SRAM)

FIG. 13 illustrates SRAM cell 600 which is disclosed in U.S. patent application Ser. No. 08/663,603, filed Jun. 14, 1996, entitled "A 6-bulk Transistor Static Memory Cell Using Split Word-Line Architecture", now U.S. Pat. No. 5,654,915 which is a continuation application of U.S. patent application Ser. No. 08/311,366, filed Sep. 23, 1994, now abandoned which is a continuation application of U.S. patent application Ser. No. 08/109,094, filed Aug. 19, 1993 now abandoned. U.S. patent applications Ser. Nos. 08/663,603, 08/311,366, and 08/109,094 are hereby incorporated herein by reference.

SRAM cell 600 includes cross-coupled latching MOSFET transistors 602, 604, 606, and 608 each having a gate, source, and drain. The gate of p-channel transistor 602 is coupled to the gate of n-channel transistor 606 via line (conductor) 626. The gate of p-channel transistor 604 is coupled to the gate of n-channel transistor 608 via line (conductor) 628. The drain of p-channel transistor 602 is coupled to the drain of n-channel transistor 606, the drain of n-channel transistor 610, and the gates of p-channel transistor 604 and n-channel transistor 608. The source of n-channel transistor 610 is coupled to bit line 624 (BL). The gate of n-channel transistor 610 is coupled to wordline 614. The drain of p-channel transistor 604 is coupled to the drain of n-channel transistor 608, the drain of n-channel transistor 612, and the gates of p-channel transistor 602 and n-channel transistor 606. The source of n-channel transistor 612 is coupled to bit line bar 622 (/BL). The gate of n-channel transistor 612 is coupled to wordline 616. Wordlines 614 and 616 may be coupled together. The source of p-channel transistor 602 is coupled to the source of p-channel transistor 604 and VCC 618. The source of n-channel transistor 606 is coupled to the source of n-channel transistor 608 and VSS 620.

SRAM cell 600 typically uses one or two layers of local interconnect to cross-couple transistors 602-608 and connect BL,/BL, VCC, and VSS to the cell. Additionally, a first layer of metal may be used to form a first supply voltage line VCC 618, a second supply voltage line VSS 620, bitline 624, and bitline bar 622. A second layer of metal may be wired in parallel to the wordlines in order to reduce their resistance.

The number of interconnect and/or metal layers may be significantly reduced using edge metal lines. In contrast to prior fabrication methods, this may enable SRAM cell 600 to be manufactured more quickly, result in a significant decrease in the cost of manufacturing SRAM cell 600, and may not increase the size of SRAM cell 600. For example, SRAM cell 600 may be fabricated using only one layer of edge metal lines to form bit line 624, bit line bar 622, and to interconnect transistors 602, 604, 606, 608, 610, and 612. Furthermore, the mixed mode method illustrated in FIGS. 12a–12e may be used to fabricate VCC 618 and VSS 620 from the same layer of metal used to fabricate the edge metal lines.

FIGS. 14a–14d illustrate cross sectional views of one embodiment of forming SRAM cell 600 illustrated in FIG. 13 using edge metal line interconnect. FIGS. 15a–15c illustrate corresponding top views along line X—X of FIGS. 14a–14c, respectively. The embodiment illustrated in FIGS. 14a–14d may use only one layer of edge metal to form bitline 624, bitline bar 622, VCC 618, VSS 620, and to interconnect transistors 602, 604, 606, 608, 610, and 612. This may be accomplished without increasing the size of SRAM cell 600. For one embodiment, SRAM cell 600 has a cell size of approximately 18.4 square microns when fabricated with multiple layers of interconnect and/or metal lines, and may have approximately the same cell size when manufactured according to the embodiment illustrated in FIGS. 14a–14d. However, preferably, the cell size may decrease to approximately 14.0 square microns or less using the present invention.

Figure 14A:
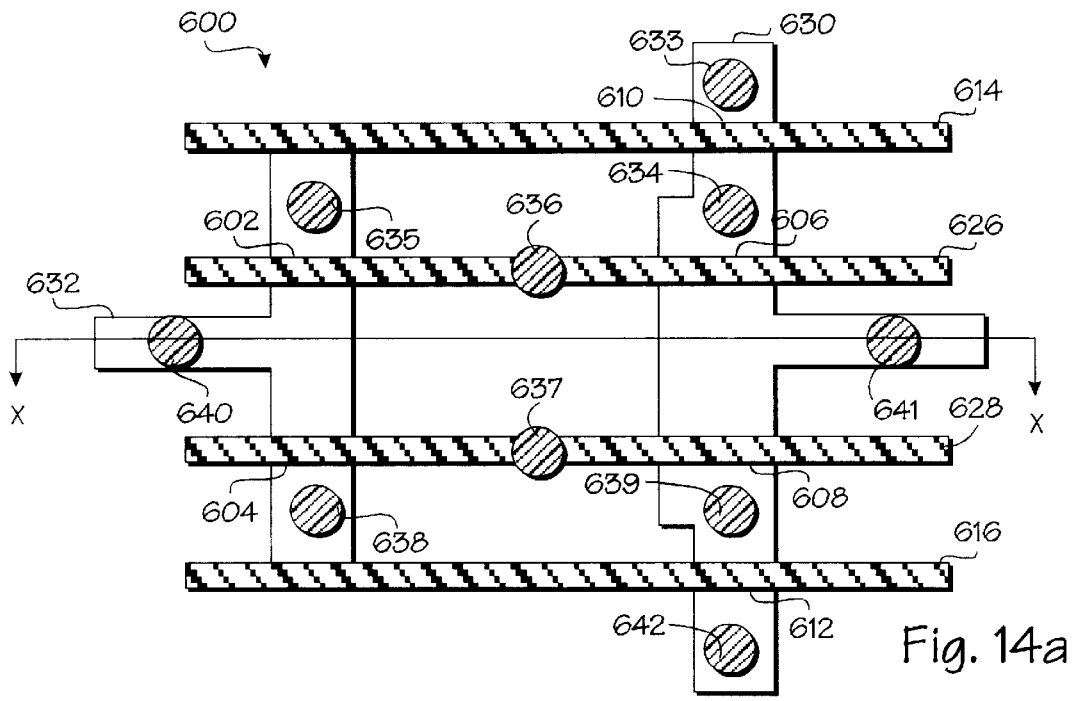
FIGS. 14a–14d are top views of one embodiment of interconnecting the circuit elements of the SRAM device of FIG. 13 using edge metal interconnect.
Figure 15C:
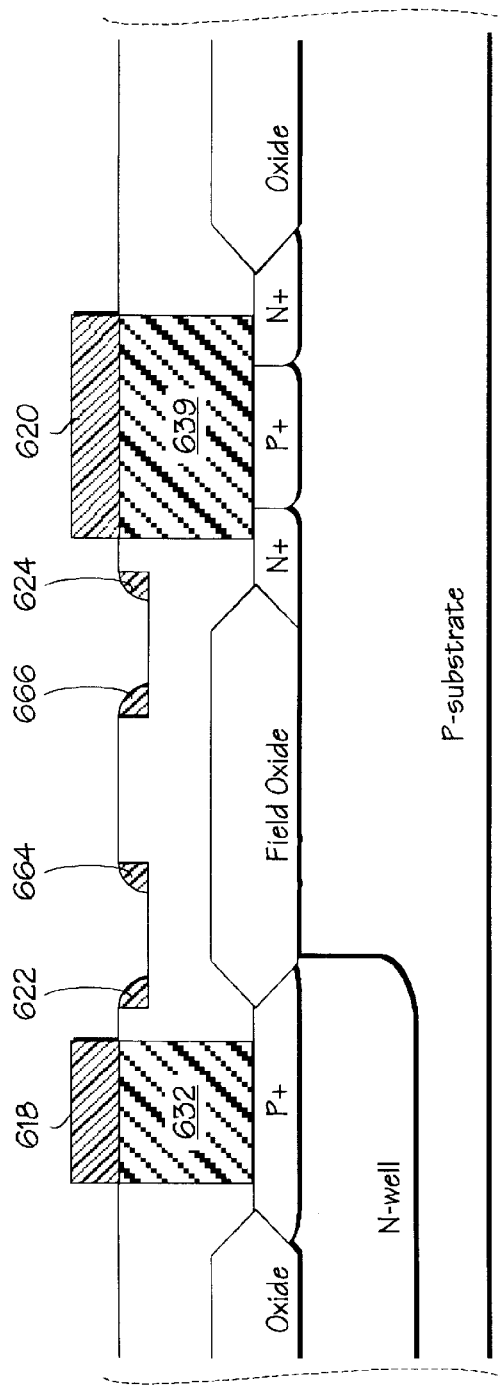

FIG. 14a shows a top view of some of the layers that form SRAM cell 600. SRAM cell 600 includes source-drain diffusion regions 630 and 632. As illustrated in FIG. 15a, source-drain diffusion regions 630 and 632 may be disposed within a p-substrate 710. As further illustrated in FIG. 15a, source-drain diffusion region 632 may comprise a P+ or P-type material disposed within an n-well 708, and source-drain diffusion region 630 may comprise an N+ or N-type material disposed in P-type substrate 710. Source-drain diffusion region 630 may also include a P-type region 712 that may form a contact to substrate 710. Source-diffusion regions 630 and 632 may be separated by field oxide 702 (e.g., SiO$_2$) and bounded by field oxides 706 and 704, respectively.

One of ordinary skill in the art will appreciate that p-channel transistors 602 and 604 may be formed where lines 626 and 628, respectively, overlap source-drain diffusion region 632. N-channel transistors 610, 606, 608, and 612 may be formed where wordline 614, line 626, line 628, and wordline 616, respectively, overlap source-drain diffusion region 630. Lines 626 and 628, and wordlines 614 and 616 may be formed from polysilicon.

SRAM cell 600 also includes contacts 633–642. As will be explained in more detail below, contact 633 that may be used to interconnect the source of n-channel transistor 610 to bitline 624, contact 642 may be used to interconnect the source of n-channel transistor 612 to bitline bar 622, contact 640 may be used to interconnect the sources of p-channel transistors 602 and 604 to VCC 618, contact 641 may be used to interconnect the sources of n-channel transistors 606 and 608 to VSS 620, and contacts 634–639 may be used to cross-couple p-channel transistors 602 and 604 to n-channel transistors 606 and 608. Contact 634 may be coupled to the drains of n-channel transistors 610 and 606. Contact 639 may be coupled to the drains of n-channel transistors 608 and 612. Contacts 635 and 638 may be coupled the drains of p-channel transistors 602 and 604, respectively. Contacts 636 and 637 may be coupled to lines 626 and 628, respectively.

Contacts 633–642 may be formed in an insulating or dielectric layer 650 formed over transistors 602, 604, 606, 608, 610, and 612, as illustrated in FIG. 15a. Dielectric layer 650 may be an oxide layer (e.g., SiO$_2$). Dielectric layer 650 is not shown in FIG. 14a so as not to obscure the teachings of FIG. 14a.

Figure 14B:
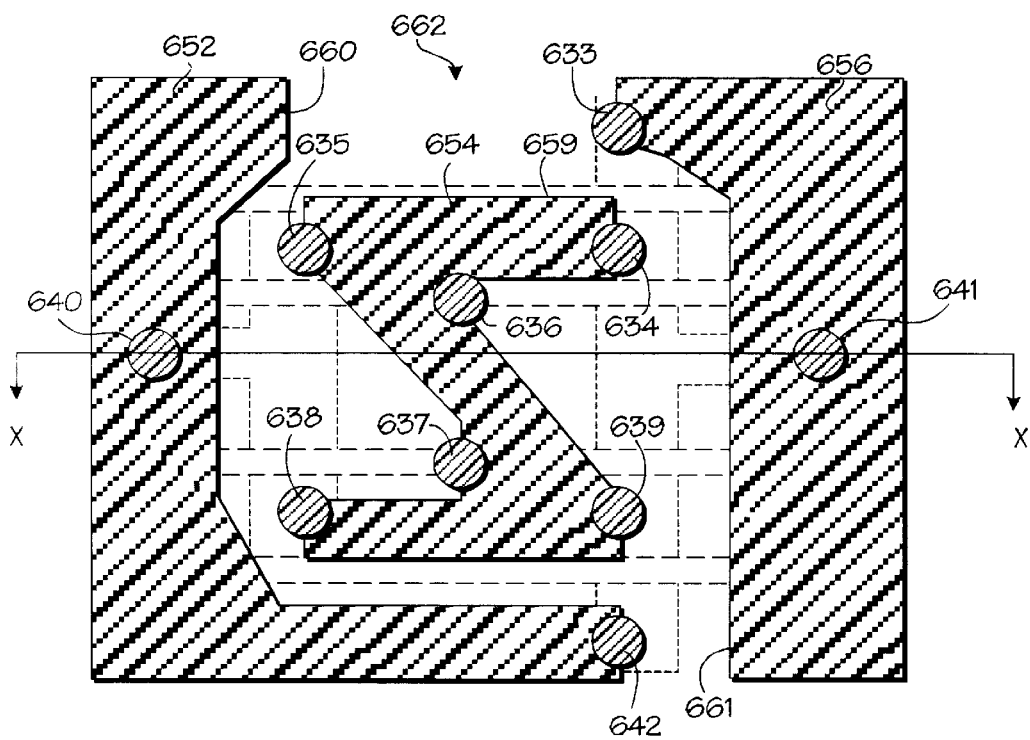
Figure 14C:
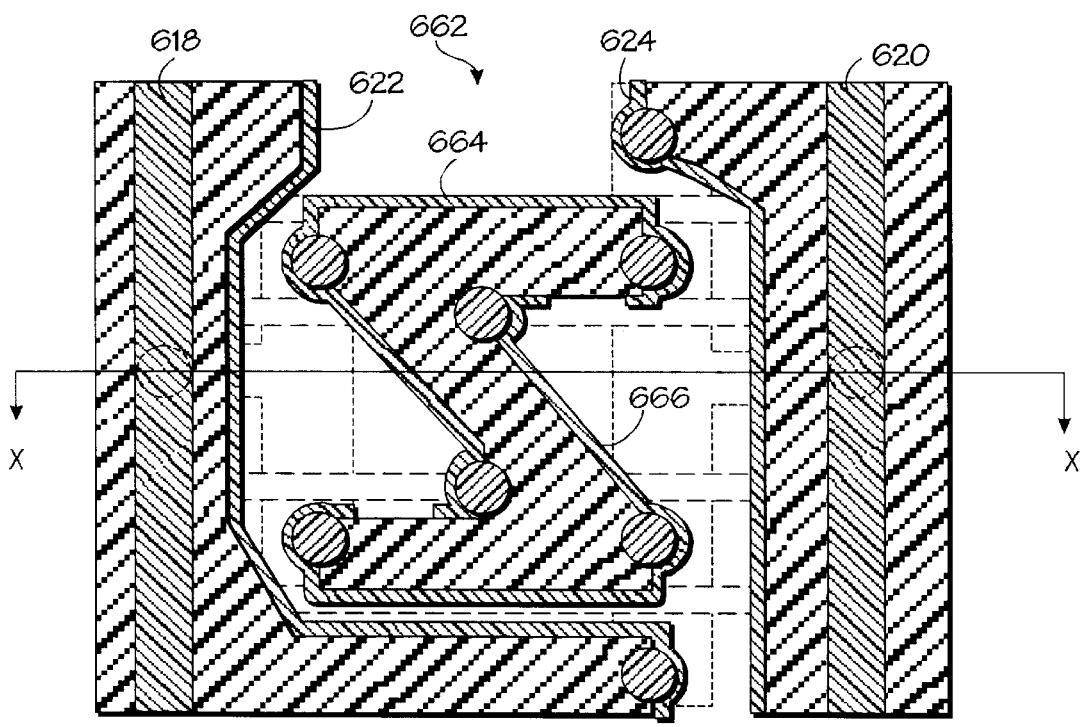

FIGS. 14b–14c (and FIGS. 15b–15c) illustrate that the mixed mode metal process illustrated in FIGS. 12a–12e may be employed to form edge metal lines for bitline 624, bitline bar 622, an edge metal line to cross-couple transistors 602, 604, 606, and 608, and bus lines VSS 620 and VCC 622 in one layer of metal and/or interconnect.

As illustrated in FIG. 14b and FIG. 15b, a trench 662 may be formed in dielectric layer 650 to form features 652, 654, and 656. Source-drain diffusion regions 630 and 632 are illustrated as dotted lines in FIG. 14b to emphasize that they are located underneath dielectric layer 650 and features 652, 654, and 656. Similarly, lines 614 and 616, and wordlines 626 and 628 are shown as dashed lines to emphasize that they are located underneath dielectric layer 650 and features 652, 654, and 656. As illustrated in FIG. 14b and FIG. 15b, trench 662 include sidewalls 659–661. Sidewall 659 may also be considered the sidewall of feature 654. Sidewall 660 may also be considered the sidewall of features 652, and sidewall 661 may also be considered the sidewall of feature 656. For one embodiment, features 652 and 656 are connected and sidewalls 660 and 661 are the same sidewall.

An imaging layer or other protective coating layer may then be patterned to cover contacts 640–641. A conductive layer may then be deposited over trench 662, and features 652, 654, and 656. The conductive layer may then be anisotropically etched to form edge metal lines adjacent to sidewalls 659–661, bus line VCC 618 over feature 652, and bus line VSS 620 over feature 656, as illustrated in FIG. 14c and FIG. 15c. The edge metal line formed adjacent to sidewall 661 forms bitline 624 connected to contact 624. Similarly, the edge metal line formed adjacent to sidewall 660 forms bitline bar 622 connected to contact 642. Portions of the edge metal line formed adjacent to sidewall 659 may be selectively removed (e.g., by a "cut" mask and etch) to form edge metal lines 664 and 666. Edge metal line 664 interconnects contacts 634, 635, and 647. Edge metal line 666 interconnects contacts 636, 638, and 639.

Figure 14D:
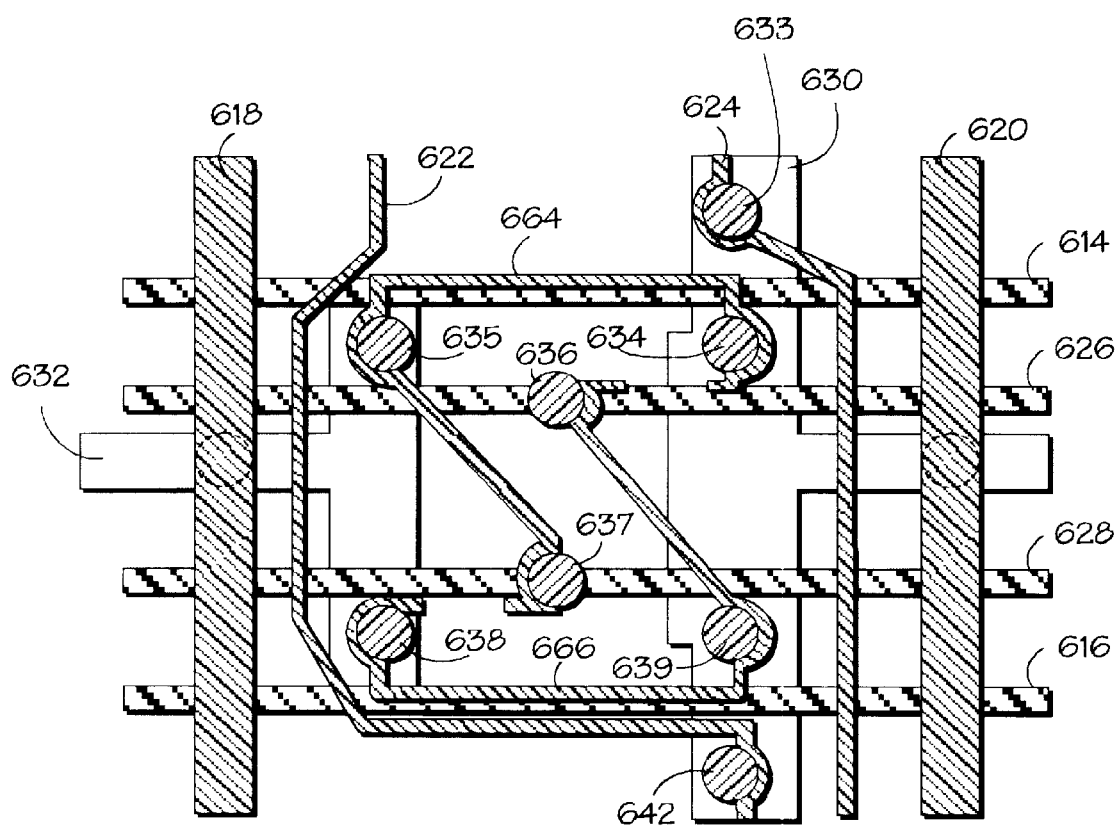

Features 652, 654, and 656 may then be removed. FIG. 14d illustrates SRAM cell 600 with features 652, 654, and 656 removed.

Figure 14E:
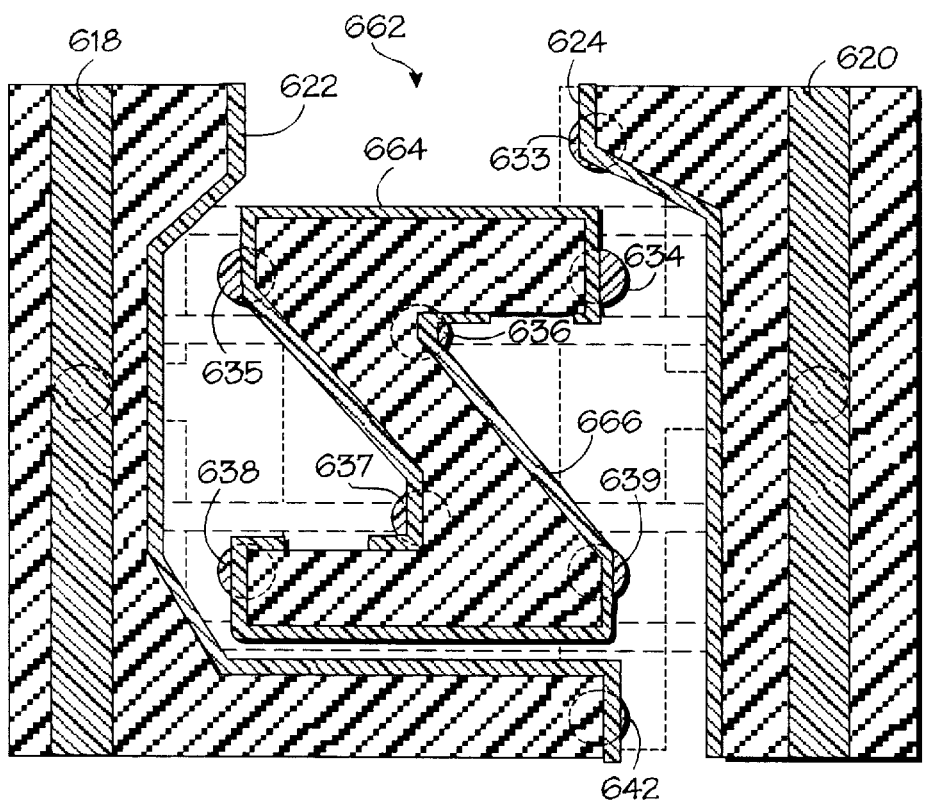
FIG. 14e is a top view of another embodiment of interconnecting the circuit elements of the SRAM device of FIG. 13 using edge metal interconnect.

FIG. 14e illustrates that bitlines 622 and 624 may be edge metal lines formed on top of contacts 642 and 633, respectively. Similarly, edge metal line 664 may be formed on top of contacts 634, 635, and 637, and edge metal line 666 may be formed on top of contacts 636, 638, and 639.

Figure 14F:
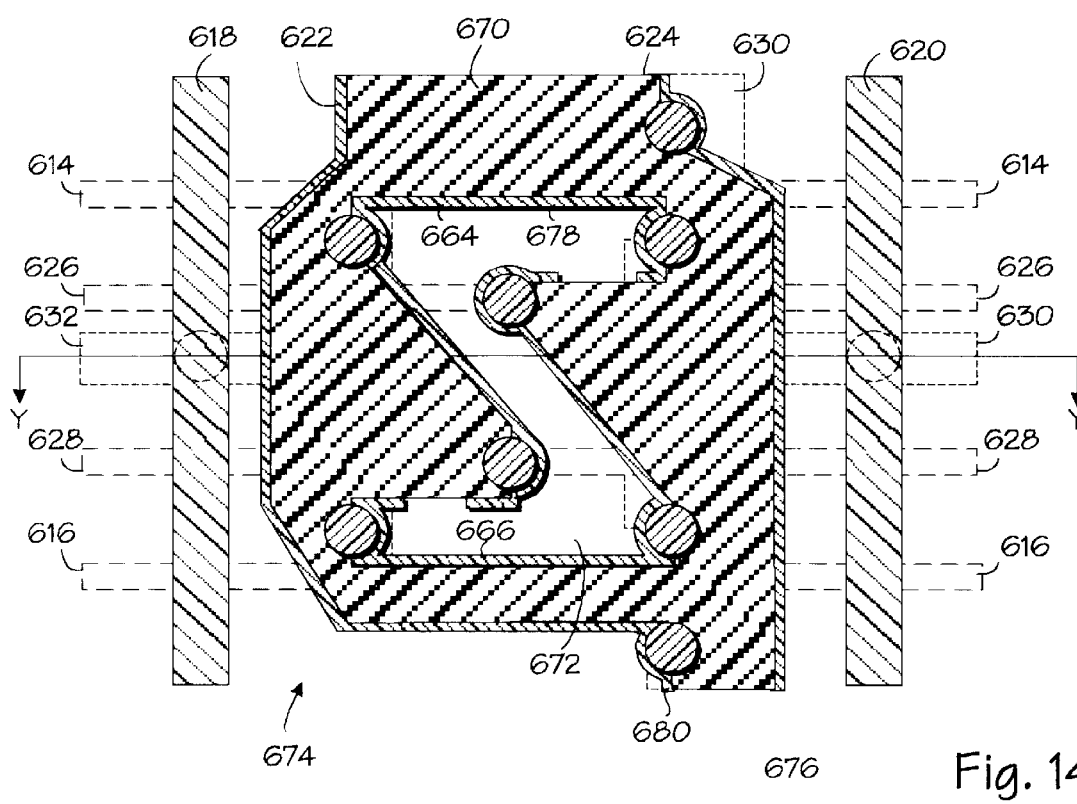
FIG. 14f is a top view of another embodiment of interconnecting the circuit elements of the SRAM device of FIG. 13 using edge metal interconnect.
Figure 15D:
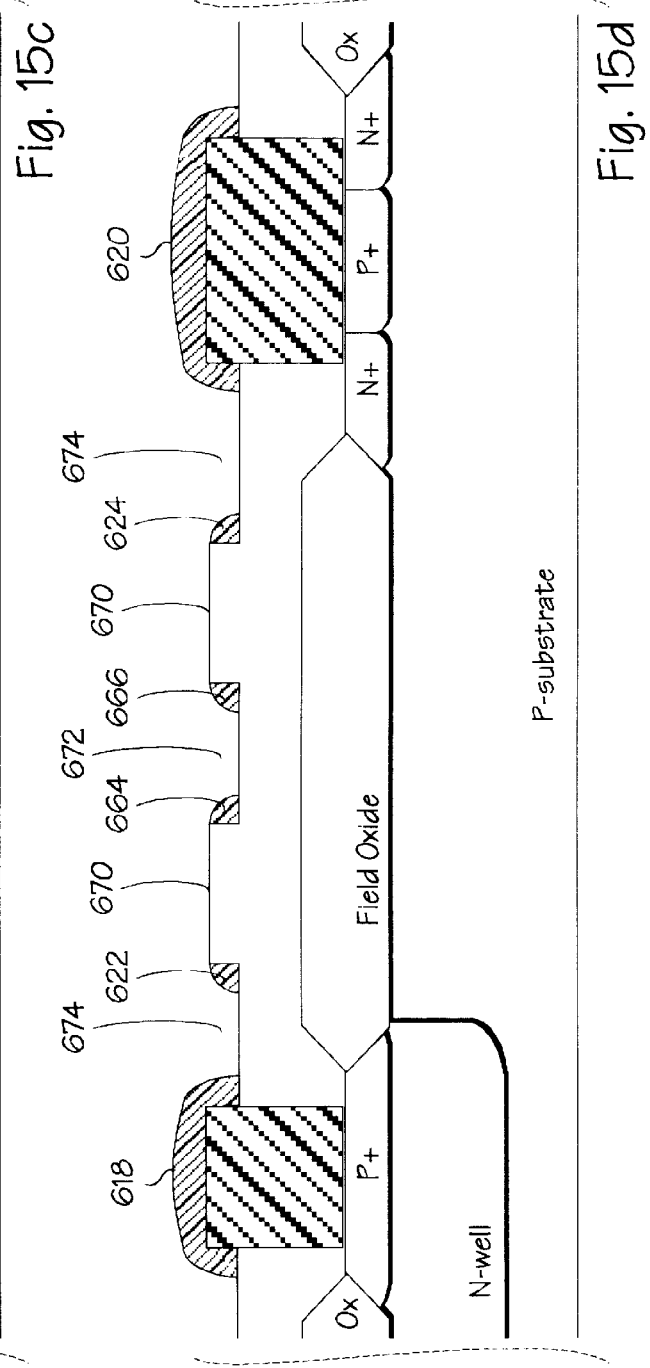
FIG. 15d is a cross sectional view of forming the SRAM device along line Y—Y of FIGS. 14f.

FIGS. 14f and 15d illustrate another embodiment of using edge metal lines to interconnect SRAM cell 600. FIG. 14f and FIG. 15d illustrate that feature 670 may be patterned into dielectric layer 650. Feature 670 may have a trench 672 having sidewalls 676, 678 and 680, and region 674 outside of feature 670. A conductive layer may then be deposited over feature 670, trench 672, and region 674 and anisotropically etched to form edge metal bitline 624 formed adjacent to sidewall 676, edge metal bitline complement ("bitline bar") 622 formed adjacent to sidewall 680, and an edge metal line formed adjacent to sidewall 678. Portions of the edge metal line formed adjacent to sidewall 678 may be selectively removed (e.g., by a "cut" mask and etch) to form edge metal lines 664 and 666. Edge metal line 664 interconnects contacts 634, 635, and 647. Edge metal line 666 interconnects contacts 636, 638, and 639.

For one embodiment, another layer of metal and/or interconnect may then be deposited form VCC 618 and VSS 620. For another embodiment, an VCC 618 and VSS 620 may be formed from separate edge metal formed from additional features.

For an alternative embodiment of FIG. 14*f*, the embodiments illustrated in FIGS. 8*a*–8*c* and 9*a*–9*b* may be used to form edge metal lines in an insulating or dielectric layer on top of contacts 633–642, and may be used to form VCC line 618 and VSS line 620 (as similarly illustrated in FIG. 14*e*).

Figure 16:
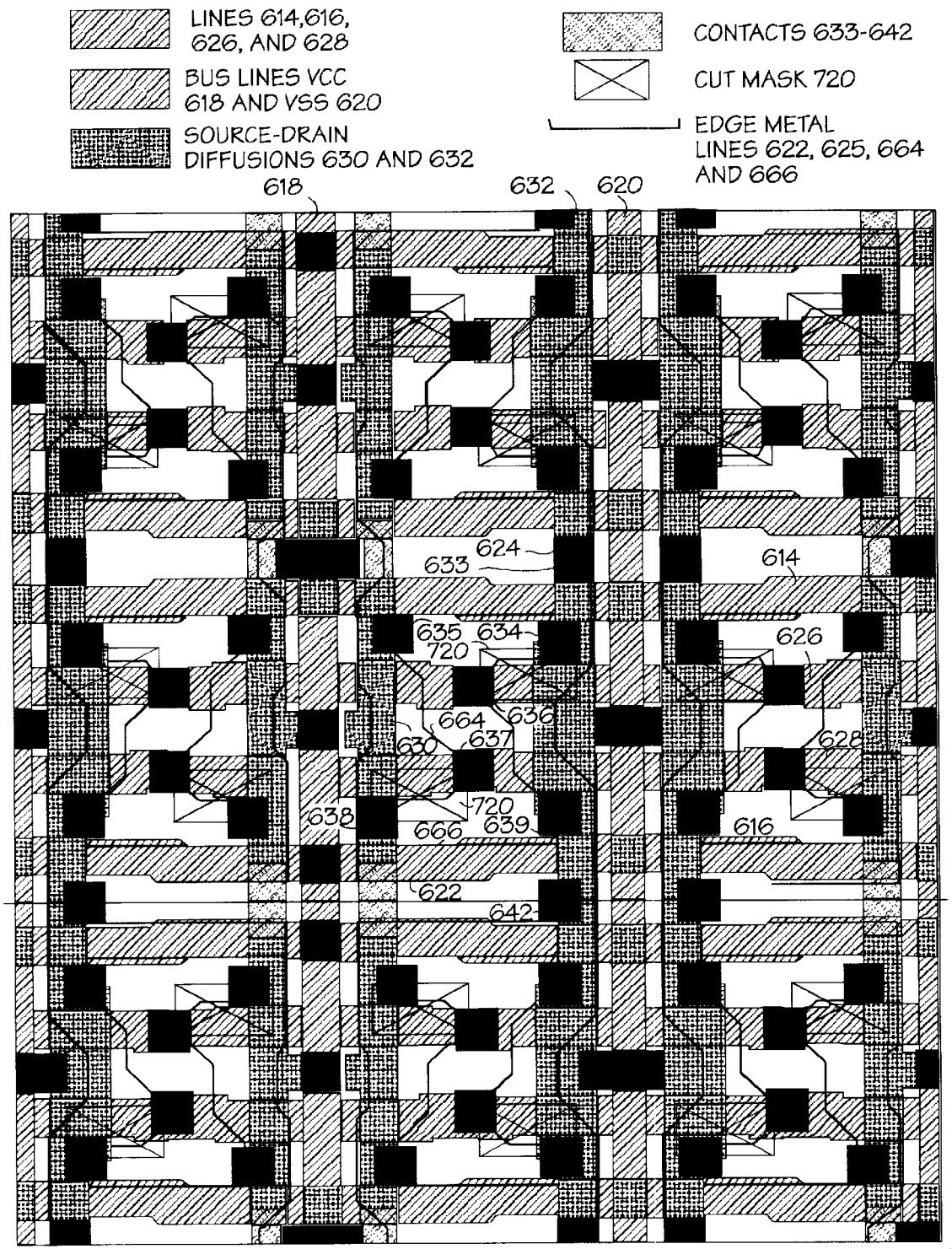
FIG. 16 is a color top view of a layout of multiple SRAM cells of FIG. 13.

FIG. 16 is a color plot of an array of nine SRAM cells each including SRAM cells 600. The color plot is provided to further enhance the illustrations of FIGS. 14*a*–14*f*. The legend included with FIG. 16 associates the various color and shapes with the features of SRAM cell 600.

FIGS. 17*a*–17*e* illustrate a cross sectional view of one embodiment of a method of forming edge metal lines and a contact in the same layer of conductive material.

Figure 17A:
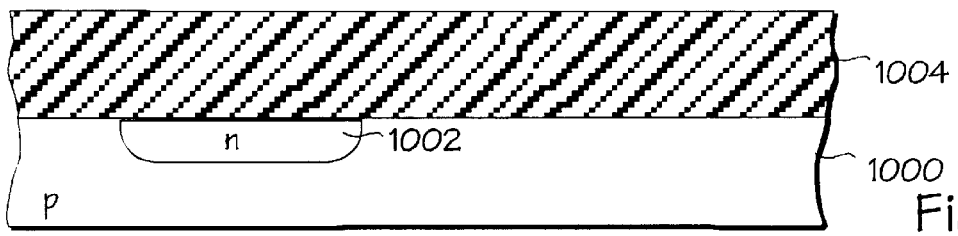
FIGS. 17a–17e are cross sectional views of one embodiment of forming a contact and an edge metal line from the same layer of metal.

FIG. 17*a* illustrates a p-type substrate 1000 having n-well 1002. P-type substrate 1000 may alternatively comprise an n-type substrate. N-well 1002 may alternatively comprise a p-well. N-well 1002 may be a source or drain region of a MOSFET transistor. FIG. 17*a* further illustrates a dielectric or insulating layer 1004 formed over the p-type substrate 1000. For one embodiment, dielectric layer 1004 may comprise $SiO_2$.

Figure 17B:
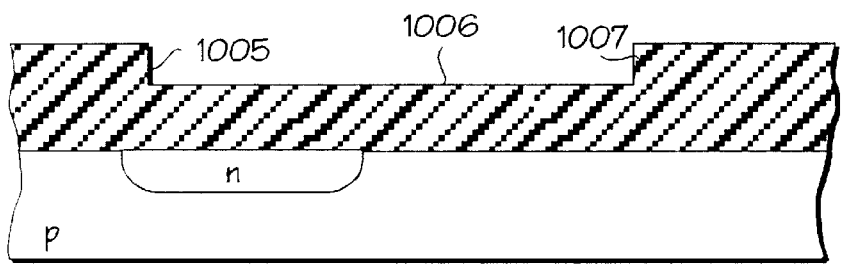

As illustrated in FIG. 17*b*, dielectric layer 1004 may then be patterned to form trench or opening 1006 having sidewalls 1005 and 1007. Trench 1006 may be formed over n-well 1002.

Figure 17C:
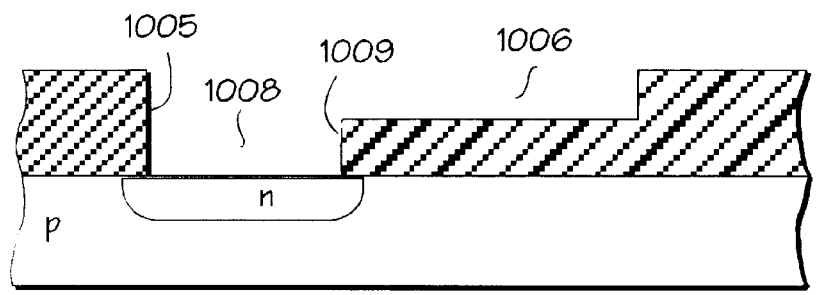

As illustrated in FIG. 17*c*, a second trench or opening 1008 may be formed in trench 1006. Trench 1008 may have sidewalls 1005 and 1009. Trench 1008 may expose n-well 1002.

Figure 17D:
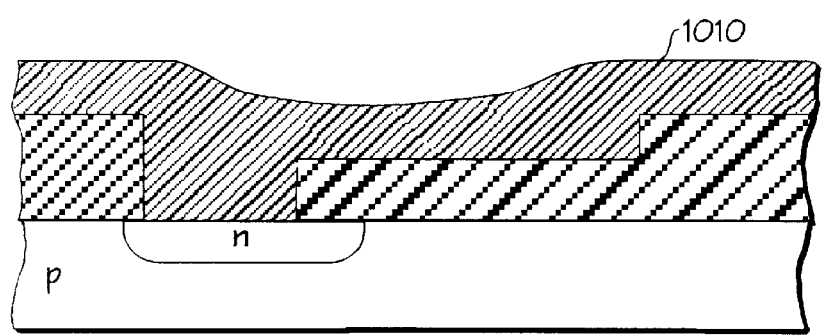

Conductive layer 1010 may then be formed over trenches 1006 and 1008, as illustrated in FIG. 17*d*. Conductive layer 1010 may be formed from any suitable material to any suitable thickness using any suitable technique. Conductive layer 1010 may includes Al, Cu, Ti, W, Cr, any combination thereof, or any alloy thereof that may or may not further include Si.

Figure 17E:
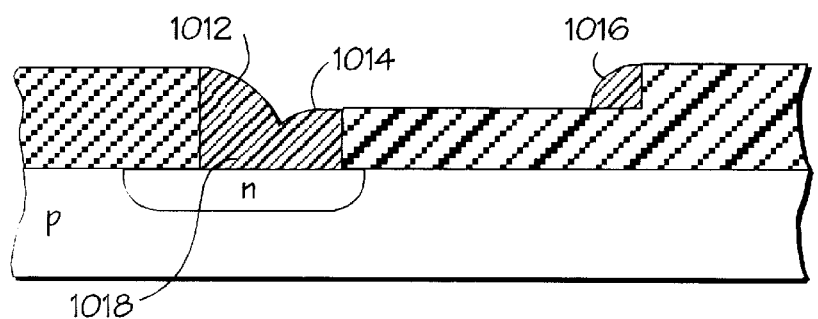

Conductive layer 1010 may then be anisotropically etched to form edge metal lines 1012, 1014, and 1016, as illustrated in FIG. 17*e*. Alternatively, a photoresist mask may be used prior to etching conductive layer 1010. This alternative embodiment may be used, for example, when chlorine is used to etch conductive layer 1010 as discussed previously with respect to FIGS. 4*a*–14*d* and FIGS. 5*a*–5*d*.

Edge metal line 1012 and 1014 may form contact 1018 within trench 1008. Contact 1018 may then be used to interconnect n-well 1002 to any other contact or feature on substrate 1000.

Edge metal line 1016 may be horizontally disposed within trench 1006 and may be used to horizontally interconnect various contacts or features formed on substrate 1000.

The process illustrated in FIGS. 17*a*–17*e* may be combined with the process illustrated in FIGS. 12*a*–12*e* such that a standard or bus metal line, a contact, and an edge metal line may be formed from the same layer of conductive material.

FIGS. 21*a*–21*d* illustrate one embodiment of forming a metal line that may be termed a "pseudo-damascene" metal line. A conventional damascene process is described in U.S. Pat. No. 5,496,771 (incorporated herein by reference) as including the steps of: depositing a planarized layer of insulation over a conductive material to which electrical contacts are be established; etching channels in the insulation layer to expose the underlying the underlying conductive material; overfilling and the channels with metalization; and planarizing the metalization to form local interconnect insulated by the insulation layer. Planarizing may be performed by conventional chemical-mechanical polishing (CMP) as is generally known in the art.

Figure 21A:
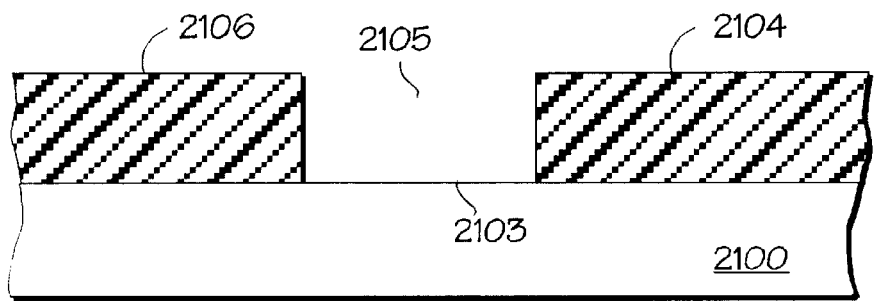
FIGS. 21a–21c illustrate cross-sectional views one embodiment of forming a pseudo-damascene metal line.

FIGS. 21*a*–21*d* illustrate one embodiment of forming a pseudo-damascene metal line in a channel using the edge metal process steps discussed above in the previous embodiments. As illustrated in FIG. 21*a*, an insulating layer may be patterned to form features 2104 and 2106, opening a trench 2105 over a substrate 2100. Trench 2105 has a base 2103. Features 2104 and 2106 may include any suitable material, have any suitable thickness, and be formed using any suitable technique for forming insulating features. For example, features 2104 and 2106 may comprise a dielectric layer including $SiO_2$. For another example, features 2104 and 2106 may comprise an imaging layer including a suitable positive photoresist, a suitable negative photoresist, a suitable radiation-sensitive polyimide, or other suitable radiation sensitive materials.

Figure 21B:
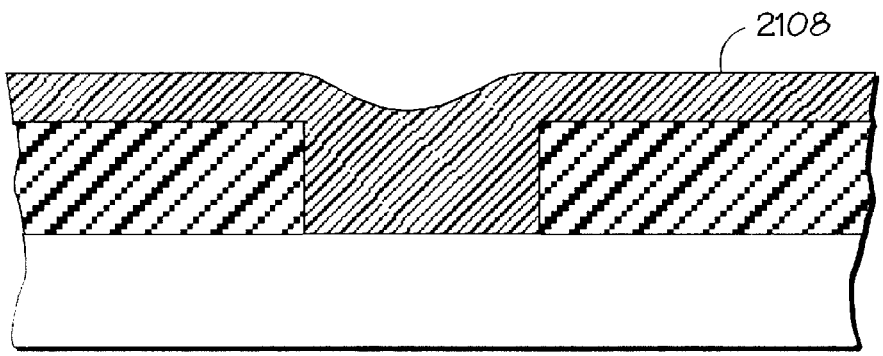

As illustrated in FIG. 21*b*, a conductive layer 2108 may be formed over substrate 2100 and features 2104 and 2106. Conductive layer 2108 may include any suitable conductive material formed to any suitable thickness using any suitable technique. For example, conductive layer 2108 may comprise a metal layer (e.g., aluminum, Al), a local interconnect layer (e.g., titanium-tungsten, TiW), or any combination thereof with additional conductive or other functional layers (e.g., a first layer of Ti and/or TiW, a subsequent layer of Al and a cap layer of titanium nitride).

Figure 21C:
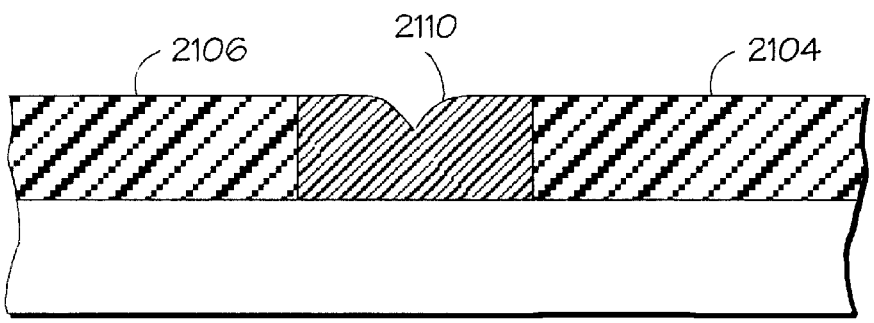

As illustrated in FIG. 21*c*, conductive layer 2108 may be subjected to a directional or anisotropic etch using, for example, reactive ion etching or a plasma etch to remove all of conductive layer 2108 on the horizontal surfaces of features 2104 and 2106. As is generally known in the art, the directional etch may be substantially anisotropic or have a substantially anisotropic effect. As described above with respect to other embodiments, a photoresist mask may be used prior to etching conductive layer 2108. Anisotropically etching or substantially anisotropically etching layer 2108 forms pseudo-damascene metal line 2110. One may control (a) the ratio of trench width to trench height and/or (b) the etch rate of the metal (given a known thickness of the metal layer) in a conventional manner to control the formation of the pseudo-damascene metal line.

Pseudo-damascene metal line 2110 may be of any suitable thickness and any suitable width. For one embodiment, the thickness of pseudo-damascene metal line 2110 may be from approximately 1000 Angstroms to approximately 10,000 Angstroms, preferably from approximately 2000 Angstroms to approximately 8000 Angstroms, and more preferably from approximately 2500 Angstroms to approximately 6000 Angstroms. For one embodiment, pseudo-damascene metal line 2110 may be approximately the same thickness as features 2104 and 2106. For another embodiment, pseudo-damascene metal line 2110 may have a thickness less than the thickness of features 2104 and 2106. The width of pseudo-damascene metal line 2110 may substantially cover base 2103 of trench 2105. The width of pseudo-damascene metal line 2110 may be any suitable width to provide the current carrying capacity and resistivity required by the circuit using pseudo-damascene metal line 2110. The width of pseudo-damascene metal line 2110 may substantially cover base 2103 of trench 2105. For example, the width of pseudo-damascene metal line 2110 may be from approximately 200 Angstroms to approximately 10,000 Angstroms, preferably from approximately 500 Angstroms to approximately 7500 Angstroms, and more preferably from approximately 700 Angstroms to approximately 4000 Angstroms.

Figure 21D:
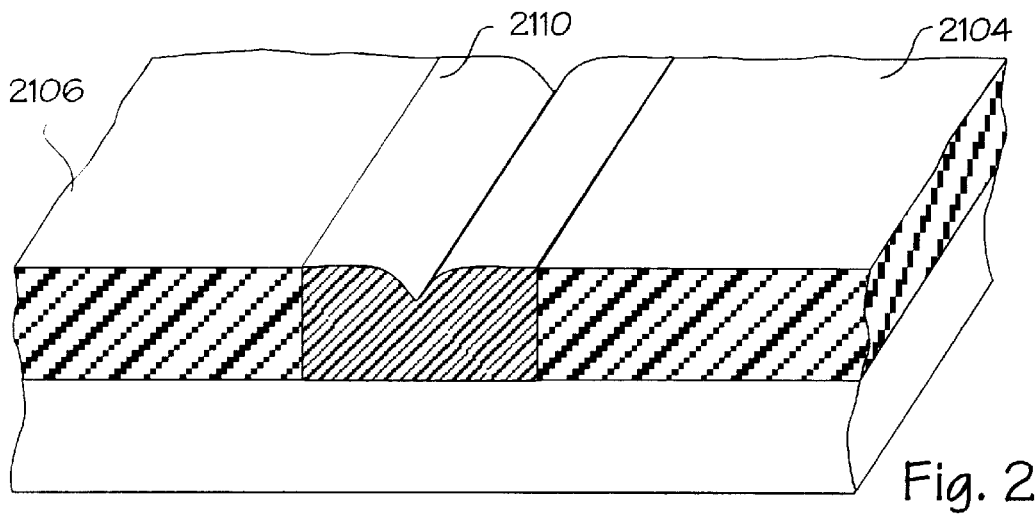
FIG. 21d illustrates a three-dimensional view of the pseudo-damascene metal line formed by process illustrated in FIGS. 21a–21c.

As illustrated in FIG. 21*d,* pseudo-damascene metal line 2110 may also be of any suitable length and may be horizontally disposed on substrate 2100 so as to horizontally interconnect contacts or other features formed on or in substrate 2100. Features 2104 and 2106 may be removed or left in place.

The method of forming pseudo-damascene metal line 2110 may not require the planarization of conductive layer 2108 as appears to be required in conventional damascene processes. In contrast, the process illustrated in FIGS. 21*a*–21*d* forms pseudo-damascene metal line 2110 by substantially anisotropically etching conductive layer 2108. Thus, conductive layer 2108 may comprise a metal such as Al that has a lower sheet resistance than typical local interconnect materials such as Ti or TiW. Additionally, the process illustrated in FIGS. 21*a*–21*d* may not require an etch stop material such as aluminum oxide as described in U.S. Pat. No. 4,789,648.

The process illustrated in FIGS. 21*a*–21*d* may be combined with the processes illustrated in previous embodiments to form a pseudo-damascene metal line, an edge metal line, a standard metal line, and/or a contact from the same layer of conductive material.

Figure 22A:
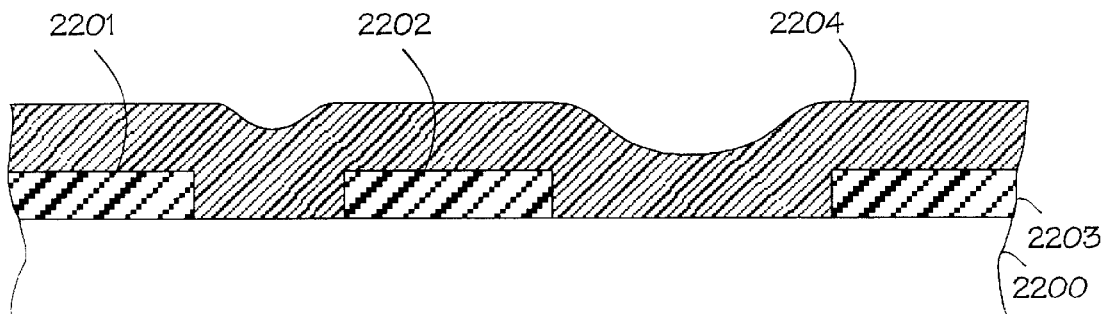
FIGS. 22a–22b illustrate one embodiment of forming a pseudo-damascene metal line and edge metal lines from the same conductive layer.
Figure 22B:
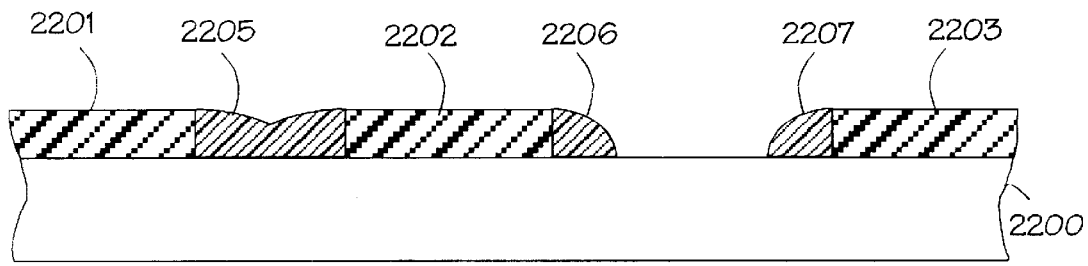

FIGS. 22*a*–22*b* illustrate one embodiment of forming a pseudo-damascene metal line and an edge metal line from the same conductive layer. The process illustrated in FIGS. 22*a*–22*b* may combine the embodiments of FIGS. 4*a*–4*d,* FIGS. 5*a*–5*d,* FIGS. 8*a*–8*d,* or FIGS. 10*a*–10*b* with the process illustrated in FIGS. 21*a*–21*d.*

As illustrated in FIG. 22*a,* conductive layer 2204 may be formed over features 2201–2203 and over substrate 2200. As illustrated in FIG. 22*b,* conductive layer 2204 may then be substantially anisotropically etched to form pseudo-damascene metal line 2205 and edge metal lines 2206 and 2207. Pseudo-damascene metal line 2205 and edge metal lines 2206–2207 may be formed over and electrically coupled to contacts in substrate 2200 (not shown). Additionally, pseudo-damascene metal line 2205 and edge metal lines 2206–2207 may be horizontally disposed over substrate 2200 and electrically interconnect various features (e.g., contacts) formed on or in substrate 2200.

Figure 23A:
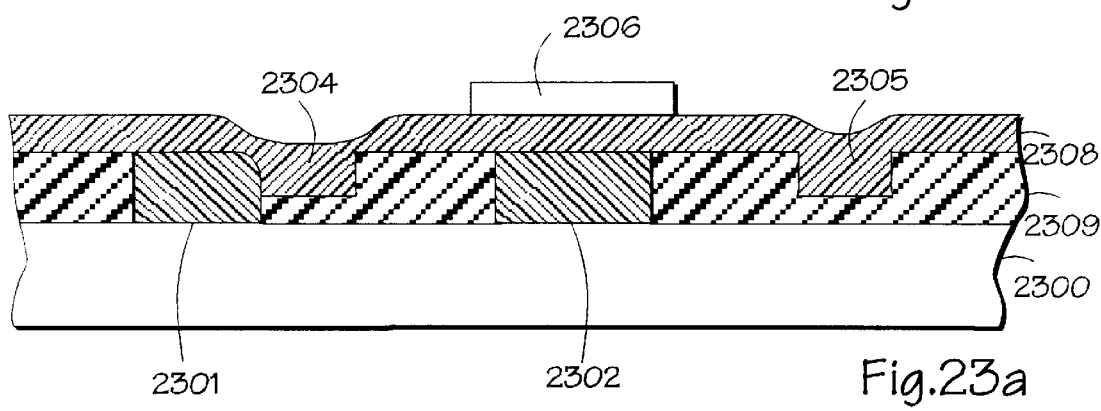
FIGS. 23a–23b illustrate one embodiment of forming a pseudo-damascene metal line, an edge metal line, and a standard metal line from the same conductive layer.
Figure 23B:
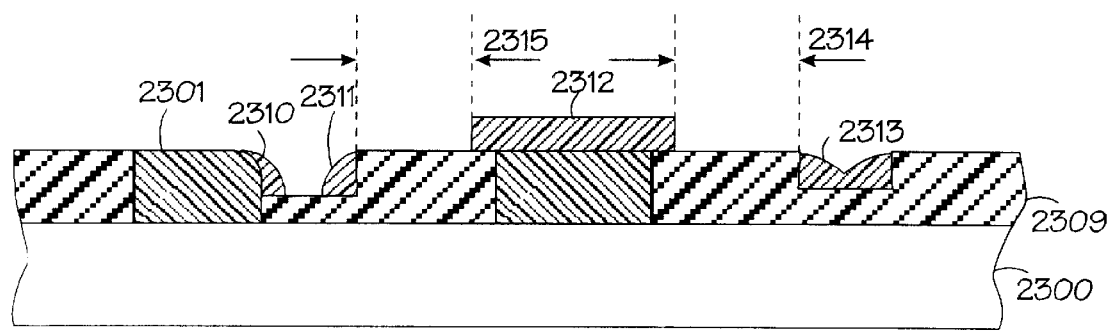

FIGS. 23*a*–23*b* illustrate one embodiment of forming a pseudo-damascene metal line, an edge metal line, and a standard metal line from the same conductive layer. The process illustrated in FIGS. 23*a*–23*b* may combine the embodiments of FIGS. 12*a*–12*e* with the process of FIGS. 21*a*–21*d.*

As illustrated in FIG. 23*a,* insulating layer 2309 may be formed over substrate 2300. Contacts 2301 and 2302 and trenches 2304 and 2305 may be formed in insulating layer 2309. Trench 2305 preferably has a smaller width-to-height ratio than trench 2304. Conductive layer 2308 may then be formed over insulating layer 2309, contacts 2301–2302, and trenches 2304–2305. Protective coating 2306 may then be formed over the portion of conductive layer 2308 that is disposed over contact 2302. Protective coating 2306 may be patterned photoresist or other suitable imaging layer.

As illustrated in FIG. 23*b,* conductive layer 2308 may then be anisotropically or substantially anisotropically etched to form pseudo-damascene metal line 2313, edge metal lines 2310–2311, and standard metal line 2312. Protective coating 2306 may then be removed.

Pseudo-damascene metal line 2313, edge metal lines 2310–2311, and standard metal line 2312 may be formed may be horizontally formed over and in insulating layer 2309 and may electrically interconnect various features (e.g., contacts) formed on or in substrate 2300 or insulating layer 2309.

As described above with respect to FIGS. 12*a*–12*e,* the process of FIGS. 23*a*–23*b* illustrates that edge metal line 2311 may be formed a distance 2315 from standard metal line 2312. Similarly, pseudo-damascene metal line 2313 may be formed a distance 2316 from standard metal line 2312. The distances 2315–2316 are not limited by the pitch of features on a metal mask, a lens, or other conventional lithography equipment as it relates to a single level of lithography. The distances 2315–2316 may be any distance and may be limited only by an alignment tolerance. For one embodiment, distances 2315–2316 may each be from approximately 0.1 $\mu$m to 5.0 $\mu$m, more preferably from approximately 0.12 $\mu$m to 2.5 $\mu$m, and most preferably from 0.2 $\mu$m to 1.0 $\mu$m.

Figure 24A:
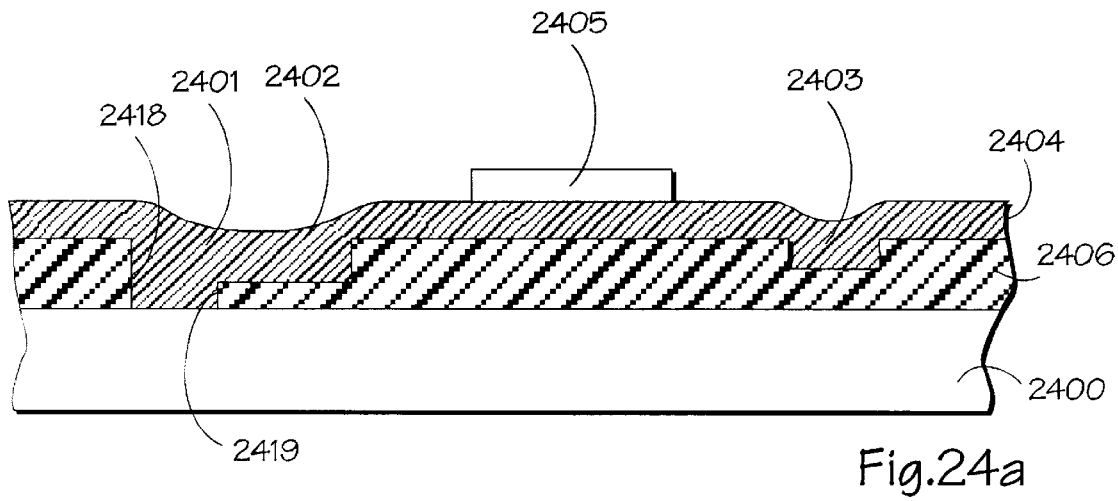
FIGS. 24a–24b illustrate one embodiment of forming a pseudo-damascene metal line, an edge metal line, a contact, and a standard metal line from the same conductive layer.
Figure 24B:
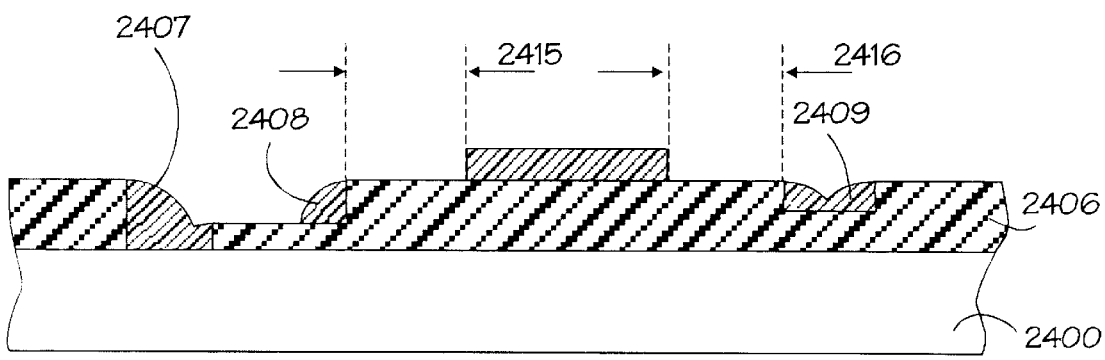

FIGS. 24*a*–24*b* illustrate one embodiment of forming a pseudo-damascene metal line, an edge metal line, a standard metal line, and a contact from the same conductive layer. The process illustrated in FIGS. 24*a*–24*b* may combine the embodiments of FIGS. 12*a*–12*e* and FIGS. 17*a*–17*e* with the process of FIGS. 21*a*–21*d.*

As illustrated in FIG. 24*a,* an insulating layer 2406 may be formed over substrate 2400. Trenches 2401–2403 may then be formed in insulating layer 2406. Preferably, trench 2403 has a width-to-height ratio smaller than trench 2402 (where the width of trench 2402 is defined by the distance from sidewall 2417 to sidewall 2418, and the height of trench 2402 is the height of sidewall 2417). The width-to-height ratio of trench 2401 (where its height is that of sidewall 2419) is preferably greater than or equal to the average of the width-to-height ratios of trenches 2402 and 2403. Conductive layer 2404 may then be formed over insulating layer 2406 and trenches 2401–2403. Protective coating 2405 may then be formed over a portion of conductive layer 2404. Protective coating 2405 may be patterned photoresist or other suitable imaging layer.

As illustrated in FIG. 24*b,* conductive layer 2404 may then be anisotropically or substantially anisotropically etched to form pseudo-damascene metal line 2409, edge metal line 2408, standard metal line 2410, and contact 2407. Protective coating 2405 may then be removed.

Pseudo-damascene metal line 2409, edge metal line 2408, and standard metal line 2410 may be formed may be horizontally formed over and in insulating layer 2406 and may electrically interconnect various features (e.g., contacts) formed on or in substrate 2400 or insulating layer 2406.

As described above with respect to FIGS. 12*a*–12*e* and FIGS. 23*a*–23*b,* the process of FIGS. 24*a*–24*b* illustrates that edge metal line 2408 may be formed a distance 2415 from standard metal line 2410. Similarly, pseudo-damascene metal line 2409 may be formed a distance 2416 from standard metal line 2410. The distances 2415–2416 are not limited by the pitch of features on a metal mask, a lens, or other conventional lithography equipment limitations relating to a single level of lithography. The distances 2415–2416 may be any distance and may be limited only by an alignment tolerance. For one embodiment, distances 2415–2416 may each be from approximately 0.1 $\mu$m to 5.0 $\mu$m, more preferably from approximately 0.2 $\mu$m to 2.5 $\mu$m, and most preferably from 0.25 $\mu$m to 1.0 $\mu$m.

Using this embodiment of the present invention, one may eliminate plugs (e.g., by filling trench 2401 with a metal serving the function of a conventional plug), and thus, form in a single metal layer all of the features and functions of conventional integrated circuits previously and/or conventionally served by multiple layers of metal (e.g., bus lines, local interconnects, plugs, contacts, etc.).

Although the present invention has been described in terms of specific embodiments, it will be appreciated that various modifications and alterations might be made by those skilled in the art without departing from the spirit and scope of the invention. The invention should therefore be measured in terms of the claims which follow.

What is claimed is:

1. A method of forming metal interconnect, comprising the steps of:
   (a) patterning a first insulating layer to form a first insulating feature having first and second sidewalls, wherein the first insulating feature is formed over first, second, third and fourth conductive features;
   (b) depositing a metal layer over the first insulating feature to electrically couple the first, second, third, and fourth conductive features;
   (c) etching the metal layer to form a first metal line adjacent to the first and second sidewalls of the first insulating feature; and
   (d) patterning the first metal line to decouple the first metal line from the third and fourth conductive features.

2. The method of claim 1, wherein the insulating layer is disposed over a substrate.

3. The method of claim 2, wherein the first metal line is disposed over less than all of the underlying substrate.

4. The method of claim 1, further comprising, after step (b) and before step (c), the step of depositing a photoresist layer over the metal layer.

5. The method of claim 4, further comprising the step of patterning the photoresist layer.

6. The method of claim 1, wherein the first metal line is annular.

7. The method of claim 1, wherein the patterning step forms a second metal line adjacent to the second sidewall and electrically coupling the third and fourth conductive features.

8. The method of claim 1, wherein the first feature comprises a trench in the first insulating layer.

9. The method of claim 8, wherein the trench has a width greater than twice the width of the first metal line.

10. The method of claim 1, further comprising the step of forming a trench in the insulating layer prior to the depositing step, wherein the trench has a base, and wherein step (c) further forms a second independent metal line that substantially covers the base of the trench.

11. The method of claim 1, wherein the first, second, third, and fourth conductive features comprise contacts.

12. The method of claim 1, further comprising the step of forming a protective coating over a portion of the metal layer, wherein step (c) further forms a second independent metal line comprising the portion of the metal layer underlying the protective coating.

13. The method of claim 12, wherein the protective coating comprises an imaging layer.

14. The method of claim 12, wherein the second metal line comprises a bus.

15. The method of claim 12, further comprising the step of forming a trench in the insulating layer prior to the depositing step, and wherein step (c) further forms a third independent metal line in the trench.

16. A method of independently forming a contact and the first metal line, comprising the method of claim 1, wherein the first feature comprises a first trench and the method further comprises the step of forming a second trench in a portion of the first trench prior to said depositing step.

17. A method of independently forming the contact, the first metal line, and a second metal line, comprising the method of claim 16, and the method further comprising the step of forming a third independent trench in the first insulating layer prior to said depositing step.

18. A method of interconnecting transistors in a memory cell, comprising the steps of:
   forming a plurality of transistors including the first, second, third, and fourth conductive features; and
   the method of claim 1, wherein at least two of the plurality of transistors are electrically interconnected, by the first metal line.

19. The method of claim 18, further comprising the step of:
   removing a portion of the first metal line to disconnect at least one of the plurality of transistors from the other plurality of transistors.

20. The method of claim 18, wherein the etching step further forms a bitline coupled to one of the plurality of transistors.

21. The method of claim 18, further comprising the step of forming a protective coating over a portion of the metal layer, wherein the etching step further forms a second metal line comprising the portion of the metal layer underlying the protective coating.

22. The method of claim 21, wherein the second metal line is a power line coupled to at least one of the plurality of transistors.

23. The method of claim 18, wherein the memory cell is a static random access memory (SRAM) cell.

24. A structure formed over a semiconductor substrate, comprising:
   an insulating layer having a first trench with a first sidewall;
   a first metal line horizontally disposed over the substrate and adjacent to the first sidewall; and
   two contacts disposed underneath the first metal line and electrically interconnected by the first metal line.

25. The structure of claim 24, wherein the first trench further includes a second sidewall, and the structure further comprises a second metal line horizontally disposed over the substrate and adjacent to the second sidewall.

26. The structure of claim 24, wherein the contacts are disposed within the first trench.

27. The structure of claim 25, further comprising a third independent metal line horizontally disposed on the first insulating layer and not directly connected to the first and second metal lines.

28. The structure of claim 27, wherein the first, second, and third metal lines each have a current capacity, the current capacity of each of the first and second metal lines being less than the current capacity of the third metal line.

29. The structure of claim 25, wherein the insulating layer has a second independent trench having a sidewall, and the structure further comprises a third metal line horizontally disposed over the substrate and adjacent to the sidewall of the second trench.

30. The structure of claim 25, wherein the second trench has a base and the third metal line substantially covers the base.

31. The structure of claim 29, further comprising:

first and second contacts that lie along a first axis and are electrically connected by the first metal line; and third and fourth contacts that lie along a second axis and are electrically connected by the second metal line, wherein the first axis intersects the second axis at a point (a) on the first axis between the first and second contacts, and (b) on the second axis between the third and fourth contacts.

32. The structure of claim 24, wherein the structure further comprises:

a second trench in a portion of the first trench; and a contact in the second trench, wherein the contact comprises the first metal line.

33. A method of connecting a first contact to a second contact and independently connecting a third contact to a fourth contact, wherein the first and second contacts lie along a first axis and the third and fourth contacts lie along a second axis, wherein the first axis intersects the second axis at a point (a) on the first axis between the first and second contacts, and (b) on the second axis between the third and fourth contacts, the method comprising the steps of:

patterning a first insulating layer to form a first feature having a first sidewall and a second sidewall, wherein the first feature overlaps the first, second, third and fourth contacts;

depositing a conductive layer over the first feature and the first, second, third and fourth contacts; and etching the conductive layer so that (a) a first interconnect line is formed adjacent to the first sidewall, electrically connecting the first and second contacts, and (b) a second interconnect line is formed adjacent to the second sidewall, electrically connecting the third and fourth contacts.

34. The method of claim 33, further comprising the step of forming the first, second, third, and fourth contacts in the first insulating layer.

35. The method of claim 33, wherein the first and second interconnect lines each comprise metal.

36. The method of claim 1, wherein the etching step is substantially anisotropic.

37. The method of claim 33, Wherein the etching step is substantially anisotropic.

38. A method of forming metal interconnect, comprising:

patterning an insulating layer to form a first insulating feature having a first sidewall and a second insulating feature having a second sidewall, wherein the first sidewall is disposed over first, second, and third conductive features, and the second sidewall is disposed over fourth, fifth, and sixth conductive features;

depositing a metal layer over the first and second insulating features;

etching the metal layer to form a first metal line electrically coupling the first, second, and third conductive features, and to form a second metal line electrically coupling the fourth, fifth, and sixth conductive features.

39. The method of claim 38, wherein the etching step is substantially anisotropic.

40. A method of forming interconnect comprising:

depositing a metal layer over an insulative layer having a sidewall;

forming a protective coating over a portion of the metal layer; and etching the metal layer to form a first metal line adjacent to the sidewall of the insulative layer, and to form a second metal line underneath the protective coating.

41. The method of claim 40, wherein the second metal line has a higher current capacity than the first metal line.

42. The method of claim 41, wherein the second metal line is a bus line.

43. The method of claim 40, wherein the protective coating comprises photoresist.

44. The method of claim 40, wherein the etching step is substantially anisotropic.

* * * * *